US012632760B2

(12) United States Patent
Molavi et al.

(10) Patent No.: US 12,632,760 B2
(45) Date of Patent: May 19, 2026

(54) SYSTEMS AND METHODS FOR TUNING CAPACITANCE OF QUBITS

(71) Applicant: D-WAVE SYSTEMS INC., Burnaby (CA)

(72) Inventors: Reza Molavi, North Vancouver (CA); Mark H. Volkmann, Burnaby (CA); Emile M. Hoskinson, Vancouver (CA); Richard G. Harris, North Vancouver (CA); Trevor M. Lanting, Vancouver (CA); Paul I. Bunyk, Pt. Roberts, WA (US); Andrew J. Berkley, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 894 days.

(21) Appl. No.: 17/786,192

(22) PCT Filed: Dec. 15, 2020

(86) PCT No.: PCT/US2020/065150
§ 371 (c)(1),
(2) Date: Jun. 16, 2022

(87) PCT Pub. No.: WO2021/126875
PCT Pub. Date: Jun. 24, 2021

(65) Prior Publication Data
US 2023/0027682 A1    Jan. 26, 2023

Related U.S. Application Data

(60) Provisional application No. 62/951,738, filed on Dec. 20, 2019.

(51) Int. Cl.
*G06N 10/40* (2022.01)
*G06F 30/347* (2020.01)
(Continued)

(52) U.S. Cl.
CPC ............. *G06N 10/40* (2022.01); *H10N 60/12* (2023.02); *G06F 30/347* (2020.01); *G06F 30/392* (2020.01); *G06F 30/394* (2020.01)

(58) Field of Classification Search
CPC ...... G06N 10/40; H01N 60/12; G06F 30/347; G06F 30/392; G06F 30/394
(Continued)

(56) References Cited

U.S. PATENT DOCUMENTS 3,573,759 A    4/1971    Zimmerman et al.
4,028,714 A    6/1977    Henkels
(Continued)

FOREIGN PATENT DOCUMENTS

CA       3029949 C    *  6/2020    ........... H03K 19/195
DE       19511172 A1      10/1996
(Continued)

OTHER PUBLICATIONS

Barends et al., "Logic gates at the surface code threhold: Superconducting qubitsd poised for fault-tolerant quantum computing", Uiniversity of California, https://arxiv.org/abs/1402.4848, 2014, 15 pages. (Year: 2014).*
(Continued)

*Primary Examiner* — Phallaka Kik
(74) *Attorney, Agent, or Firm* — Cozen O'Connor

(57) ABSTRACT

A qubit within an analog computing system with two or more body loops is discussed, along with inductors disposed along at least one of the body loops to provide tunable inductance and increase or decrease the qubit capacitance. Near and far inductors can be tuned to homogenize the inductance and capacitance of the qubit across a range of programmable states based on predicted and target inductance and capacitance for the qubit.

22 Claims, 11 Drawing Sheets

(51) Int. Cl.
  *G06F 30/392*  (2020.01)
  *G06F 30/394*  (2020.01)
  *H10N 60/12*  (2023.01)
(58) Field of Classification Search
  USPC ........................... 716/119, 126; 977/70, 759
  See application file for complete search history.

(56) References Cited

U.S. PATENT DOCUMENTS

| | | | |
|---|---|---|---|
| 4,504,926 A | 3/1985 | Toyoda | |
| 4,769,753 A | 9/1988 | Knudson et al. | |
| 4,956,642 A | 9/1990 | Harada | |
| 5,162,731 A | 11/1992 | Fujimaki | |
| 5,323,344 A | 6/1994 | Katayama et al. | |
| 5,326,986 A | 7/1994 | Miller et al. | |
| 5,329,165 A | 7/1994 | Kao et al. | |
| 5,768,297 A | 6/1998 | Shor | |
| 5,787,307 A | 7/1998 | Imoto | |
| 5,869,846 A | 2/1999 | Higashino et al. | |
| 5,917,322 A | 6/1999 | Gershenfeld et al. | |
| 6,128,764 A | 10/2000 | Gottesman | |
| 6,157,044 A | 12/2000 | Nakanishi et al. | |
| 6,169,981 B1 | 1/2001 | Werbos | |
| 6,317,766 B1 | 11/2001 | Grover | |
| 6,360,112 B1 | 3/2002 | Mizuno et al. | |
| 6,459,097 B1 | 10/2002 | Zagoskin | |
| 6,495,854 B1 | 12/2002 | Newns et al. | |
| 6,504,172 B2 | 1/2003 | Zagoskin et al. | |
| 6,563,310 B2 | 5/2003 | Zagoskin | |
| 6,563,311 B2 | 5/2003 | Zagoskin | |
| 6,605,822 B1 | 8/2003 | Blais et al. | |
| 6,614,047 B2 | 9/2003 | Tzalenchuk et al. | |
| 6,627,915 B1 | 9/2003 | Ustinov et al. | |
| 6,627,916 B2 | 9/2003 | Amin et al. | |
| 6,633,053 B1 | 10/2003 | Jaeger | |
| 6,649,929 B2 | 11/2003 | Newns et al. | |
| 6,670,630 B2 | 12/2003 | Blais et al. | |
| 6,728,131 B2 | 4/2004 | Ustinov | |
| 6,753,546 B2 | 6/2004 | Tzalenchuk et al. | |
| 6,803,599 B2 | 10/2004 | Amin et al. | |
| 6,838,694 B2 | 1/2005 | Esteve et al. | |
| 6,885,325 B2 | 4/2005 | Omelyanchouk et al. | |
| 6,897,468 B2 | 5/2005 | Blais et al. | |
| 6,900,454 B2 | 5/2005 | Blais et al. | |
| 6,900,456 B2 | 5/2005 | Blais et al. | |
| 6,911,664 B2 | 6/2005 | Il et al. | |
| 6,919,579 B2 | 7/2005 | Amin et al. | |
| 6,930,320 B2 | 8/2005 | Blais et al. | |
| 6,936,841 B2 | 8/2005 | Amin et al. | |
| 6,943,368 B2 | 9/2005 | Amin et al. | |
| 6,960,780 B2 | 11/2005 | Blais et al. | |
| 6,978,070 B1 | 12/2005 | Mccarthy et al. | |
| 6,979,836 B2 | 12/2005 | Zagoskin et al. | |
| 6,984,846 B2 | 1/2006 | Newns et al. | |
| 7,002,174 B2 | 2/2006 | Il et al. | |
| 7,015,499 B1 | 3/2006 | Zagoskin | |
| 7,133,888 B2 | 11/2006 | Kohn et al. | |
| 7,135,701 B2 | 11/2006 | Amin et al. | |
| 7,230,266 B2 | 6/2007 | Hilton et al. | |
| 7,253,654 B2 | 8/2007 | Amin | |
| 7,307,275 B2 | 12/2007 | Lidar et al. | |
| 7,335,909 B2 | 2/2008 | Amin et al. | |
| 7,418,283 B2 | 8/2008 | Amin | |
| 7,533,068 B2 | 5/2009 | Maassen et al. | |
| 7,605,600 B2 | 10/2009 | Harris | |
| 7,613,764 B1 | 11/2009 | Hilton et al. | |
| 7,624,088 B2 | 11/2009 | Johnson et al. | |
| 7,639,035 B2 | 12/2009 | Berkley | |
| 7,843,209 B2 | 11/2010 | Berkley | |
| 7,876,248 B2 | 1/2011 | Berkley et al. | |
| 7,880,529 B2 | 2/2011 | Amin | |
| 7,898,282 B2 | 3/2011 | Harris et al. | |
| 8,008,942 B2 | 8/2011 | Van et al. | |
| 8,018,244 B2 | 9/2011 | Berkley | |
| 8,035,540 B2 | 10/2011 | Berkley et al. | |

| | | | |
|---|---|---|---|
| 8,098,179 B2 | 1/2012 | Bunyk et al. | |
| 8,102,185 B2 | 1/2012 | Johansson et al. | |
| 8,169,231 B2 | 5/2012 | Berkley | |
| 8,190,548 B2 | 5/2012 | Choi | |
| 8,195,596 B2 | 6/2012 | Rose et al. | |
| 8,421,053 B2 | 4/2013 | Bunyk et al. | |
| 8,536,566 B2 | 9/2013 | Johansson et al. | |
| 8,611,974 B2 | 12/2013 | Maibaum et al. | |
| 8,644,898 B1 | 2/2014 | De Andrade et al. | |
| 8,854,074 B2 | 10/2014 | Berkley | |
| 8,951,808 B2 | 2/2015 | Ladizinsky et al. | |
| 9,015,215 B2 | 4/2015 | Berkley et al. | |
| 9,152,923 B2 | 10/2015 | Harris et al. | |
| 9,495,644 B2 | 11/2016 | Chudak et al. | |
| 9,727,823 B2 | 8/2017 | Amin | |
| 9,870,277 B2 | 1/2018 | Berkley | |
| 10,037,493 B2 | 7/2018 | Harris et al. | |
| 10,068,180 B2 | 9/2018 | Amin et al. | |
| 10,312,141 B2 | 6/2019 | Kirby et al. | |
| 10,528,886 B2 | 1/2020 | Boothby | |
| 10,552,755 B2 | 2/2020 | Lanting et al. | |
| 10,938,346 B2 | 3/2021 | Berkley et al. | |
| 11,127,893 B2 | 9/2021 | Johnson et al. | |
| 11,182,230 B2 | 11/2021 | Berkley et al. | |
| 11,424,521 B2 | 8/2022 | Whittaker et al. | |
| 11,494,683 B2 | 11/2022 | Amin et al. | |
| 2001/0020701 A1 | 9/2001 | Zagoskin | |
| 2001/0023943 A1 | 9/2001 | Zagoskin | |
| 2002/0060635 A1 | 5/2002 | Gupta | |
| 2002/0117656 A1 | 8/2002 | Amin et al. | |
| 2002/0179937 A1 | 12/2002 | Ivanov et al. | |
| 2002/0180006 A1 | 12/2002 | Franz et al. | |
| 2002/0188578 A1 | 12/2002 | Amin et al. | |
| 2003/0016069 A1 | 1/2003 | Furuta et al. | |
| 2003/0071258 A1 | 4/2003 | Zagoskin et al. | |
| 2003/0111661 A1 | 6/2003 | Tzalenchuk et al. | |
| 2003/0193097 A1 | 10/2003 | Il et al. | |
| 2003/0207766 A1 | 11/2003 | Esteve et al. | |
| 2003/0224944 A1 | 12/2003 | Il et al. | |
| 2004/0000666 A1 | 1/2004 | Lidar et al. | |
| 2004/0012407 A1 | 1/2004 | Amin et al. | |
| 2004/0016918 A1 | 1/2004 | Amin et al. | |
| 2004/0071019 A1 | 4/2004 | Magnus et al. | |
| 2005/0047245 A1 | 3/2005 | Furuta et al. | |
| 2005/0224784 A1 | 10/2005 | Amin et al. | |
| 2006/0147154 A1 | 7/2006 | Thom et al. | |
| 2008/0116448 A1* | 5/2008 | Kitaev | G06N 10/40 |
| | | | 257/30 |
| 2008/0215850 A1 | 9/2008 | Berkley et al. | |
| 2008/0258753 A1* | 10/2008 | Harris | B82Y 10/00 |
| | | | 326/4 |
| 2009/0078931 A1* | 3/2009 | Berkley | B82Y 10/00 |
| | | | 257/E39.012 |
| 2009/0322374 A1 | 12/2009 | Przybysz et al. | |
| 2011/0057169 A1* | 3/2011 | Harris | H03K 19/1954 |
| | | | 977/933 |
| 2011/0060780 A1 | 3/2011 | Berkley et al. | |
| 2012/0094838 A1 | 4/2012 | Bunyk et al. | |
| 2012/0124432 A1 | 5/2012 | Pesetski et al. | |
| 2014/0229722 A1 | 8/2014 | Harris | |
| 2015/0032991 A1 | 1/2015 | Lanting et al. | |
| 2015/0111754 A1* | 4/2015 | Harris | H03K 3/38 |
| | | | 365/162 |
| 2015/0219730 A1 | 8/2015 | Tsukamoto et al. | |
| 2015/0263736 A1 | 9/2015 | Herr et al. | |
| 2016/0132785 A1* | 5/2016 | Amin | G06F 15/82 |
| | | | 712/42 |
| 2016/0335558 A1* | 11/2016 | Bunyk | G06N 10/40 |
| 2017/0256698 A1 | 9/2017 | Nayfeh et al. | |
| 2018/0054201 A1 | 2/2018 | Reagor et al. | |
| 2018/0247217 A1 | 8/2018 | Heeres et al. | |
| 2018/0314970 A1 | 11/2018 | Harris et al. | |
| 2018/0341874 A1 | 11/2018 | Puri et al. | |
| 2019/0013065 A1* | 1/2019 | Przybysz | G06N 10/40 |
| 2019/0019098 A1 | 1/2019 | Przybysz | |
| 2019/0164959 A1 | 5/2019 | Thomas et al. | |
| 2019/0237648 A1 | 8/2019 | Przybysz et al. | |
| 2019/0392878 A1 | 12/2019 | Murduck et al. | |
| 2020/0036332 A1 | 1/2020 | Abdo | |

(56)                References Cited

U.S. PATENT DOCUMENTS

| | | | |
|---|---|---|---|
| 2020/0090738 A1 | 3/2020 | Naaman et al. | |
| 2020/0320426 A1* | 10/2020 | Amin | G06N 10/40 |
| 2020/0401649 A1 | 12/2020 | Lanting | |
| 2021/0013391 A1 | 1/2021 | Johnson et al. | |
| 2021/0073667 A1* | 3/2021 | Harris | G06N 10/40 |
| 2021/0190885 A1 | 6/2021 | Swenson et al. | |
| 2021/0248506 A1 | 8/2021 | Hoskinson et al. | |
| 2022/0020913 A1 | 1/2022 | Harris et al. | |
| 2022/0123048 A1 | 4/2022 | Swenson et al. | |
| 2022/0374755 A1* | 11/2022 | Didier | G06N 10/40 |
| 2023/0010205 A1* | 1/2023 | Sank | G06N 10/40 |
| 2023/0027682 A1 | 1/2023 | Molavi et al. | |
| 2023/0106489 A1 | 4/2023 | Harris | |
| 2023/0370069 A1 | 11/2023 | Amin et al. | |

FOREIGN PATENT DOCUMENTS

| | | | | | |
|---|---|---|---|---|---|
| EP | 0251568 A1 | 1/1988 | | | |
| EP | 0916961 A2 | 5/1999 | | | |
| EP | 1085422 A2 | 3/2001 | | | |
| KR | 20190015330 A | 2/2019 | | | |
| WO | 9612305 A1 | 4/1996 | | | |
| WO | 03090161 A2 | 10/2003 | | | |
| WO | 03090161 A3 | 2/2005 | | | |
| WO | 2005093649 A1 | 10/2005 | | | |
| WO | WO-2010028183 A2 * | 3/2010 | | B82Y 10/00 | |
| WO | WO-2012064974 A2 * | 5/2012 | | G06N 10/40 | |
| WO | 2015013532 A1 | 1/2015 | | | |
| WO | 2017192733 A2 | 11/2017 | | | |
| WO | 2019126396 | 6/2019 | | | |
| WO | 2021126875 A1 | 6/2021 | | | |
| WO | 2022155140 A1 | 7/2022 | | | |
| WO | 2023004040 A1 | 1/2023 | | | |
| WO | 2023114811 A1 | 6/2023 | | | |
| WO | 2023219656 A2 | 11/2023 | | | |
| WO | 2024050333 A1 | 3/2024 | | | |
| WO | 2024102504 A2 | 5/2024 | | | |
| WO | 2024172854 A2 | 8/2024 | | | |

OTHER PUBLICATIONS

Ghiu et al., "Asymmetric two-output quantum processor in any dimension", https://www.researchgate.net/publication/2199659_Asymmetric_two-output_quantum_processor_in_any_dimension, Oct. 2, 2018, 8 pages. (Year: 2018).*
Martinis et al., "Superconducting Qubits and the Physics of Josephson Junctions", National Institute of Standards and Technology, https://arxiv.org/abs/cond-mat/0402415, Feb. 16, 2004, 26 pages. (Year: 2004).*
Wang et al., "Measurement of the Decay of Fock States in a Superconducting Quantum Circuit", Physical Review Letters, No. 101, Dec. 12, 2008, 4 pages. (Year: 2008).*
Harris, Experimental Demonstration of a Robust and Scalable Flux Qubit, arXiv:0909.4321v1 [cond-mat.supr-con], Sep. 24, 2009, 20 pages.
Aassime et al., "Radio-frequency Single-electron Transistor as Readout Device for Qubits: charge sensitivity and backaction", Phys Rev Lett 86, pp. 3376-3379, 2001.
Benatti et al., "Testing Macroscopic Quantum Coherence", II Nuovo Cimento B 110, No. 5-6, pp. 593-610, 1995.
Briegel et al., "Quantum repreaters for Communication", arXiv.org:quant-ph/9803056, pp. 1-8 (1998), 1998.
Castellano et al., "A Squid Switch for a Macroscopic Quantum Coherence Experiment", Inst. Phys. Conf. Ser. No. 167, pp. 593-596 (2000).
Costabile et al., "rf-Induced steps in intermediate length Josephson-tunnel junctions", J Appl Phys 63, pp. 5406-5410 (1988), 1988.
De Bruyn Ouboter et al., "Multi-terminal SQUID controlled by the transport current", Physica B 205, pp. 153-162 (1995), 1995.
Feldman et al., "Josephson Junctions Digital Circuits", FED Report, Feb. 1998, 22 pages.

Gotz et al., "Harmonic current-phase relation in Nb—A1-based superconductor/ normal conductor/ superconductor-type Josephson junctions betWeen 4.2 K and the critical temperature", ApplPhys. Lett. 77, pp. 1354-1356 (2000).
Greenberg et al., "Low-frequency characterization of quantum tunneling in flux qubits", ArXiv.org preprint server: cond-mat/0208076, last accessed on Aug. 20, 2004.
Grover, "A fast quantum mechanical algorithm for database search", Proceedings of the 28th Annual ACM Symposium on the Theory of Computing, pp. 212-219 (1996).
Il'ichev et al., "Characterization of superconducting structures designed for qubit realizations", Appl. Phys. Lett. 80, pp. 4184-4186, 2002.
Il'ichev et al., "Degenerate Ground State in a Mesoscopic YBa2Cu3O7-x Grain Boundary Josephson Junction", Phys. Rev. Lett. 86, pp. 5369-5372, 2001.
Il'ichev et al., "Radio-frequency based monitoring of small supercurrents", Rev. Sci. Instrum. 72, pp. 1882-1887, 2001.
Il'ichev et al., "Radio-frequency method for characterization of superconducting weak links," Physica C 350, pp. 244-248, 2001.
Il'ichev et al., "Temperature dependence of the current-phase relation for YBa2Cu3O7-x step-edge Josephson junctions", App. Phys. Lett. 72, pp. 731-733, 1998.
Ioffe et al., "Environmentally decoupled sds—Wave Josephson junctions for quantum computing", Nature 398, pp. 679-681 (1999).
Jones et al., "Implementation of a quantum search algorithm on a quantum computer", Nature 393, pp. 344-346 (1998).
Jonker et al., "On quantum and classical computing with arrays of superconducting persistent current qubits", Proceedings fifth IEEE International workshop on computer architectures for machine perception, Padova, italy, 11-13 Spe 2000, pp. 69-78.
Ketchen, "Integrated Thin Film do-SQUID sensors", IEEE Transactions on Magnetics 23, pp. 1650-1657, 1987.
Kitaev et al., "Quantum measurements and the Abellan StabiliZer Problem", arXiv:quant-ph/9511026, pp. 1-22 (1995).
Knill et al., "Resilient Quantum Computation", Science 279, pp. 342-345 (1998).
Korotkov et al., "Charge Sensitivity of Radio-Frequency Single Electron Transistor", Appl. Phys Lett. 74, pp. 4052-4054 (1999).
Krech, "Linear Microwave Response of a Charge-Type Qubit", IEEE Trans. Appl. Supercond. 11, pp. 1022-1025, 2001.
Makhlin et al., "Nano-electronic circuits as quantum bits", ISACS 2000 Geneva. IEEE International Symposium on Circuits and Systems. Emerging Technologies of the 21st century Geneva, Switzerland, Mar. 28-32, 2000, pp. 241-244 vol. 2, Mar. 1, 2000.
Rey-de-Castro et al., "Design of an RSFQ Control Circuit to Observe MQC on an rf-Squid", IEEE Transactions on Applied Superconductivity 11, pp. 1014-1017 (2001).
Rifkin et al., "rf SQUID's in the nonhysteretic mode: Detailed comparison of theory and experiment," J. App. Phys 47, pp. 2645-2650, 1976.
Schmidt et al., "Experimental investigations of the stationary behaviour of thin film double SQUIDS", Physica B&C Netherlands vol. 125B+C No. 2, Aug. 1984, pp. 185-198, Aug. 1, 1984.
Schoelkopf et al., "The Radio-Frequency Single-Electron Transistor (RF-Set): A Fast and Ultrasensitive Electrometer", Science 280, pp. 1238-1242 (1998).
Shor, "Polynominal—Time Algorithms for Prime Factorization and Discrete Logarithms on a Quantum Computer", SIAM Journal on Computing 26, pp. 1484-1509 (1997).
Silver et al., "Quantum States and Transitions in Weakly Connected Superconducting Rings", Phys. Rev 157, pp. 317-341, 1967.
Stolz et al., "LTS SQUID sensor with a new configuration," Supercon. Sci. Tech. 12, pp. 806-808, 1999.
Van der Wal et al., "Quantum Superposition of Macroscopic Persistent current states", Science 290, pp. 773-777, 2000.
Vandersypen et al., "Experimental realiZation of order-finding With a quantum computer", ArXiv.org:quant-ph/0007017, pp. 1-4 (2000).
Walraff et al., "Annular Long Josephson Junctions in a Magnetic Field: Engineering and Probing the Fluxon Interaction Potential", J. Low Temp. Phys. 118, pp. 543-553 (2000).

(56) References Cited

OTHER PUBLICATIONS

Xi et al., "Effects of Fields induced hole density modulation on normal state and superconducting transport in YBa2Cu307-x", Physical Review Letters, 68, pp. 1240-1243, 1992.

Zagoskin, "A scalable, tunable qubit, based on a clean DND or grain boundary D_D junction", Los Alamos National Laboratory preprint cond-mat/9903170, pp. 1-8, 1999.

Zahn, "Experimental Apparatus for the measurement if the quantum interferences of the critical current of DC-tunnel SQUIDs", Experimentelle technik der physik East Germany vol. 28, No. 2, 1980, pp. 163-168, 1980.

Zahn, "The critical current of the low damped DC-Squid", Experimentelle technik der physik East Germany vol. 31, No. 4, 1983, pp. 311-318, 1983.

Zhang et al., "Non-constant bias current for do SQUID operation", Physica C 368, pp. 181-184, 2002.

Zhang et al., "Operation of high-temperature rf SQUID magnetometers using dielectric SrTIO3 resonators", App. Phys. Lett. 67, pp. 3183-3185, 1995.

Watanabe, M. et al., "Resonance-Free Low-Pass Filters for the AC Josephson Voltage Standard," IEEE Transactions on Applied Superconductivity, 16(1), Mar. 2006, 5 pages.

Allman, et al., "RFSQUID-Mediated Coherent Tunable Coupling Between a Superconducting Phase Qubit and a Lumped Element Resonator", arXiv:1001.0816v1 [cond-mat.supr-con], Jan. 6, 2010.

Amin et al., "Thermally assisted adiabatic quantum computation," arXiv:cond-mat/0609332v2, pp. 1-5, (Mar. 2, 2007) Feb. 1, 2006.

Amin, "Effect of Local Minima on Adiabatic Quantum Optimization," arXiv:0709.0528v2, Apr. 4, 2008.

Anton, et al., "Magnetic Flux Noise in dc SQUIDs: Temperature and Geometry Dependence", Physical Review Letters, PRL 110, 147002, Apr. 5, 2013.

Auger James M. Fault-tolerance thresholds for the surface code with fabrication errors, arXiv: 1706.04912v1, Jun. 15, 2017.

Barends, et al., Logic Gates at the Surface Code Threshold: Superconducting Qubits Poised for Fault-tolerant Quantum Computing, 2014, arXiv:1402.4848.

Blais, et al., "Cavity quantum electrodynamics for superconducting electrical circuits" an architecture for quantum computation, arXiv:cond-mat/0402216v1, Feb. 7, 2004, pp. 1-14 (Year: 2004).

Brennen et al., "Why should anyone care about computing with anyons?," arXiv:0704.2241v1 [quant-ph], pp. 1-12, Apr. 18, 2007.

Chancellor, et al., "Scalable Universal Holonomic Quantum Computation Realized with an Adiabatic Quantum Data Bus and Potential Implementation Using Superconducting Flux Qubits", arXiv: 1301.7100v3 [quant-ph], Mar. 21, 2013, 10 pages.

Chow, et al., "Complete Universal Quantum Gate Set Approaching Fault-tolerant Thresholds with Superconducting Qubits", arXiv: 1202.5344v1 [quant-ph], Feb. 23, 2012, 13 pages.

Clarke et al., "Quiet Readout of Superconducting Flux States," Physica Scripta. T102: 173-177, 2002.

Cosmelli, C., "Controllable Flux Coupling for the Integration of Flux Qubits," arXiv:cond-mat/0403690v1 [cond-mat. supr-con]. Mar. 29, 2004, 10 pages.

Devitt, Quantum Error Correction for Beginners, arXiv: 0905. 2794v4 [quant-ph], Jun. 21, 2013, 2013.

Economist, Quantum Dreams, Economist,pp. 1-3 (Mar. 8, 2001), Science & Technology.

Farhi et al., "Quantum Adiabatic Evolution Algorithms versus Simulated Annealing," MIT-CTP #3228, arXiv:quant-ph/0201031 v1, pp. 1-16, Jan. 8, 2002.

Filippov et al., "Tunable Transformer for Qubits Based on Flux States," IEEE Transactions on Applied Superconductivity 13(2): 1-4, Jun. 2003.

Geerlings, et al., "Improving the Quality Factor of Microwave Compact Resonators by Optimizing Their Geometrical Parameters", arXiv: 1204.0742v3 [cond-mat.supr-con], Jun. 5, 2012.

Ghiu et al., "Asymmetric two-output quantum processor in any dimension," arXiv:quant-ph/0610138v1, pp. 1-8, Oct. 17, 2006.

Harris et al., "A Compound Josephson Junction Coupler for Flux Qubits With Minimal Crosstalk," arXiv:0904.3784v3 [cond-mat. supr-con], Jul. 16, 2009, 5 pages.

Harris et al., "Experimental Investigation of an Eight-Qubit Unit Cell in a Superconducting Optimization Processor," arXiv: 1004. 1628v2, Jun. 28, 2010, 16 pages.

Harris,"Sign and Magnitude Tunable Coupler for Superconducting Flux Qubits", arXiv:cond-mat/0608253v1, Aug. 11, 2006, 2006.

Hofheinz, et al., "Generation of Fock States in a Superconducting Quantum Circuit", Nature 454, pp. 310-314, Jul. 1, 2008.

Hofheinz, et al., "Synthesizing Arbitrary Quantum Staes in a Superconducting Resonator, Nature", vol. 459, pp. 546-549, May 28, 2009.

Ilichev, et al., "Continuous Monitoring of Rabi Oscillations in a Josephson Flux Qubit", Physical Review Letters 91(9): 097906-1-097906-4, week ending Aug. 19, 2003.

Inokuchi et al., "Analog computation using quantum-flux parametron devices," Physica C 357-360 :1618-1621, 2001.

Johnson, et al; "A scalable control system for a superconducting adiabatic quantum optimization processor"; Superconductor Science and Technology; IOP Publishing; Supercond. Sci. Technol. 23 (2010); vol. 23, No. 6, Jun. 1, 2010, 12 pages.

Jordan, et al., "Perturbative Gadgets at Arbitrary Orders", arXiv:0802. 1874v4 [quant-ph], Jan. 31, 2012.

Knill, Mathematical and Computational Sciences Division, National Standards and Technology, Boulder, CO, Oct. 22, 2018, 21 pages.

LaForestFlux-vector Model of Spin Noise in Superconducting Circuits: Electron Versus Nuclear Spins and Role of Phase Transition, arXiv: 1501.03776v3 [cond-mat.supr-con], Jul. 21, 2015, 2015.

Lanting, Evidence for Temperature Dependent Spin-diffusion as a Mechanism of Intrinsic Flux Noise in SQUIDs, arXiv: 1306.1512v3 [cond-mat.supr-con], Dec. 23, 2013.

Levitov, et al., "Quantum Spin Chains and Majorana States in Arrays of Coupled Qubits," arXiv:cond-mat/0108266v2 [cond-mat. mes-hall]. Aug. 19, 2001, 7 pages.

Lidar , Towards Fault Tolerant Adiabatic Quantum Computation, arXiv: 0707.0021v3 [quant-ph], May 2, 2008.

Manucharyan et al., "Fluxonium: single Cooper pair circuit free of charge offsets", arXiv:0906.0831v2, [cond-mat.mes-hall] Oct. 20, 2009, 13 pages.

Mc Hugh et al., "A quantum computer using a trapped-ion spin molecule and microwave radiation," arXiv:quant-ph/0310015v2, pp. 1-9, Apr. 13, 2004.

Paik, et al., "Observation of High Coherence in Josephson Junction Qubits Measured in a Three-dimensional Circuit QED Architecture", arXiv: 1105.4652v4 [quant-ph], Nov. 2, 2011.

Pop, et al., "Experimental Demonstration of Aharonov-Casher Interference in a Josephson Junction Circuit", arXiv:1104.3999v1 [cond-mat.mess-hall], Apr. 20, 2011.

Sendelbach, et al., "Complex Inductance, Excess Noise, and Surface Magnetism in dc SQUIDs", Physical Review Letters 103, 117001, Sep. 11, 2009.

VanDenBrink Mediated Tunable Coupling of Flux Qubits, New Journal of Physics 7 (2005) 230, Nov. 7, 2005.

Venturelli et al., "Quantum Optimization of Fully-Connected Spin Glasses", arXiv, Jun. 29, 2014.

Wang, et al., "Measurement of the Decay of Fock States in a Superconducting Quantum Circuit", arXiv:0808.3279v1 [cond-mat. mess-hall], Aug. 24, 2008.

Wenner, et al., "Catching Time-Reversed Microwave Photons with 99.4% Absorption Efficiency", arXiv: 1311.1180v2 [quant-ph], Nov. 16, 2013.

Yin, et al., "Controlled Catch and Release of Microwave Photon States", arXiv: 1208.2950v1 [cond-mat.supr-con], Aug. 14, 2012.

Zagoskin-Superconducting Qubits, La Physique au Canada 63(4):215-227, 2007.

Semenov , et al., Semenov, et al., "Classical and Quantum Operation Modes of the Reversible Logic Circuits," Department of Physics and Astronomy, Stony Brook University, Stony Brook, New York, Presentation, Dec. 2006, 29 pages.

Wang, Z. L, et al., "Quantum state characterization of a fast tunable superconducting resonator,"Letters 102, 163503 (2013), 4 pages.

(56) References Cited

OTHER PUBLICATIONS

Kerman, et al., "IARPA Quantum ENhances Optimiztion"(QEO) Study, Office of the Director of Natioanal Intelligence, Oct. 16, 2015.

Oliver, Quantum Enhanced Optimization: Experimental Study Overview, IARPA, Lincoln Laboratory, Massachusetts Institute of Technology, Oct. 26, 2025.

Van den Brink, "Galvanic coupling of FLux Qubits: Simple Theory and Tunability", arXiv:cond-mat/0605398v1 [cond-mat.supr-con], May 16, 2006.

Van der Wal, Quantum Superpositions of Persistent Josephson Currents, DUP Science, Sep. 24, 2001.

Baust,, Characterization of Flux-driven Josephson Parametric Amplifiers, Diploma Thesis, Technische Universitat Munchen, Aug. 2010, 119 pages.

Bell et al., "Traveling Wave Parametric Amplifier based on a chain of Coupled Asymmetric SQUIDs", arXiv:1509.04573 [cond-mat. supr-con], Sep. 15, 2015.

Bell, et al, "SQUID Based Superconducting Traveling-Wave Parametric Amplifier", IEEE/CSC & ESAS Superconductivity News Forum (global edition), Oct. 2014, 3 pages.

Chamon, et al., "A superconducting circuit realization of combinatorial gauge symmetry", arXiv:2006.10060v1 [quant-ph] Jun. 17, 2020, 9 pages.

Chancellor et al., "Circuit design for multi-body interactions in superconducting quantum annealing systems with applications to a scalable architecture", arXiv:1603.09521v5, Oct. 13, 2017.

Christopher Eichler et al., 'Controlling the dynamic range of a Josephson parametric amplifier', EPJ Quantum Technology, vol. 1, No. 2, Jan. 29, 2014.

Bergeal et al., "Josephson-based Parametric Amplifiers for Quantum Measurements", Quantum-Mechanical Electronics Lab, Applied Physics and Physics, Yale University, Nov. 9, 92 pages.

Devoret, et al., "Introduction to Quantum-limited parametric Amplification of Quantum Signals with Josephson Circuits", arXiv:1605. 00539v2, May 25, 2016, 28 pages.

Eddins, et al, "Josephson Parametric Amplifiers: Theory and Application", Quantum Nanoelectronics Laboratory, Department of Physics, University of CA, Berkley, Workshop on Microwave Cavity Design for Axion Detection Livermore Valley Open Campus, Aug. 2015.

Kitaev, "Fault-tolerant quantum computation by anyons", arXiv:quant-ph/9707021v1 Jul. 9, 1997, 27 pages.

Lechner et al., "A quantum annealing architecture with all-to-all connectivity from local interactions", Science Advances. Oct. 23, 2015. https://advances.sciencemag.org/content/1/9/e1500838.

Macklin, et al., "A near-quantum-limited Josephson traveling-wave parametric amplifier", Science Sciencemag. org,, Oct. 16, 2015, vol. 350, Issue 6258, 5 pages.

Puri, et al., "Quantum Annealing with All-to-all Connected Nonlinear Oscillators", Nature Communications, vol. 8, Article No. 15785, Jun. 8, 2017, 9 pages.

Sete, et al., "Purcell Effect with Microwave Drive: Suppression of Qubit Relaxation Rate", arXiv: 1401.5545v2, Mar. 21, 2014, 15 pages.

Simbierowicz, et al., "Flux-driven Josephson Parametric Amplifier for Sub-GHz Frequencies Fabricated with Side-wall Passivated Spacer Junction Technology", arXiv:1805.07307v1, May 18, 2018, 15 pages.

White et al., "Traveling wave parametric amplifier with Josephson junctions using minimal resonator phase matching", Applied Physics Letters 106, Jun. 15, 2015.

Zhao, et al. "Two-photon Driven Kerr Resonator for Quantum Annealing with Three-dimensional Circuit QED", arXiv:1712. 03613v2, Dec. 12, 2017, 13 pages.

Zhou et al., "Experimental Realization of Spin Liquids in a Programmable Quantum Device", arXiv:2009.07853v2, 2020.

Al-Saidi et al., "Eigenstates of a small Josephson junction coupled to a resonant cavity", Physical Review B, 65, pp. 014512-1 to 014512-7, 2001.

Armour et al., "Entangle ment and Decoherence of a Micromechanical Resonator via Coupling to a Cooper-Pair Box", Physical RevieW Letters, 88, pp. 148304-1 to 148301-4, 2002.

Averin et al., "Quantum Computing and Quantum Measurements With Mesoscopic Josephson Junctions", Fortschritte der Physik 48, pp. 1055-1074, 2000.

Barone et al., "Quantum Computation With Aharonov-Bohm Qubits", WWW.arXiv.org preprint: cond-mat/0203038 v1 (Mar. 2, 2002).

Blais et al., "Quantum netWork optimization", Physical RevieW A, 64, pp. 022312-1 to 022312-5 (2001).

Buisson et al., "Entangled states in a Josephson charge qubit coupled to a superconducting resonator", arXiv.org: cond/mat/0008275 (2000).

Burkard et al., "Spintronics and Quantum Dots for Quantum Computing and Quantum Communication," Fortschritte der Physik 48, pp. 965-986, 2000.

Cory et al., "NMR Based Quantum Information Processing: Achievements and Prospects", Fortschritte der Physik 48, pp. 875-907, 2000.

Cottet et al., "Implementation of a combined charge-phase quantum bit in a superconducting circuit", Physica C 367, pp. 197-203, 2002.

DiVincenzo et al., "Experimental Proposals for Quantum Computaton", H-K Lo and S.L. Braunstein (eds.), chapter 1, Wiley-VCH Verlag GmbH, Berlin (2001), also published WWW. ArXiv.org preprint: quant-ph/0002077 (Apr. 13, 2000).

Dykman, "Quantum Computing Using Electrons Floating on Liquid Helium", Fortschritte der Physik 48, pp. 1095-1108, 2000.

Ettinger et al., "An Integrated 20 GHZ SiGe Bipolar Differential Oscillator With High Tuning Range".

Grangier et al., "Implementations of Quantum Computing Using Cavity Quantum Electrodynamics", Fortschritte der Physik 48, pp. 859-874, 2000.

Hekking et al., "Cooper Pair BOX Coupled to a Current-Biased Josephson Junction", arXiv.org:cond-mat/0201284 (2002).

Hu et al., "Decoherence and dephasing in spin-based solid state quantum computers", arXiv.org:cond--mat/0108339 (2001).

Joyez et al., "Observation of Parity-Induced Suppression of Josephson Tunneling in the Superconducting Single Electron Transistor", hysical Review Letters, 72(15)12458 2461, (1994).

Kane et al., "Silicon-based Quantum Computation", Fortschritte der Physik 48, pp. 1023-1041, 2000.

Kulik et al., "Quantum Computational Gates With Radiation Free Couplings", WWW.arXiv.org preprint1 cond-mat/0203313 v1 (Mar. 14, 2002).

Leggett et al., "Dynamics of the dissipative tWo-state system", RevieWs of Modern Physics, 59, pp. 1-85, 1987.

Lidar et al., "Quantum Codes for Simplifying Design and Suppressing Decoherence in Superconducting Phase-Qubits", Quant. Inf. Proc. 1, pp. 155-182, 2002.

Lidar et al., "Reducing Constraints on Quantum Computer Design by Encoded Selective Recoupling", Phys. Rev. Lett. 88, 017905, pp. 1-4, 2002.

Majer et al., "Simple phase bias for superconducting circuits", Applied Physics Letters 80 pp. 3638-3640, 2002.

Makhlin et al., "Josephson-Junction Qubits", Fortschritte der Physik 48, pp. 1043-1054, 2000.

Marquardt et al., "Superposition of tWo mesoscopically distinct quantum states: Coupling a Cooper-pair boX to a large superconducting island", Physical RevieW B, 63, pp. 054514-054520 (2001).

Mooij et al., "Quantum superposition of macroscopic persistent—current states", Science, 290, pp. 773-777, 2000.

Olariu et al., "The quantum effects of electromagnetic fluxes," Rev. Mod. Phys. 57, pp. 339-436 and 13 pages of figures, 1987.

Orlando et al., "Engineering the Quantum Measurement Process for the Persistent Current Qubit", Physica C 3681294-299 (Mar. 2002).

Plastina et al. "Communicating Josephson qubits", arXiv.org:cond-mat/0206586 (2002).

Poyatos et al., "Schemes of Quantum Computations With Trapped Ions", Fortschritte der Physik 48, pp. 785-799, 2000.

Rifkin et al., "Current-Phase relation and phase-dependent conductance of superconducting point contacts from rf impedance measurements", Phys. Rev. B ]313894-3901 (1976).

(56) References Cited

OTHER PUBLICATIONS

Schmidt, "The Physics of Superconductors", P. Muller and AV. Ustinov (Eds.), Springer, 1997, chapter 4.

Shnirman et al., "Quantum measurements performed With a single-electron transistor", Phys. Rev. B 57(24) 115400-15407 (1998).

Spiller et al., "Superconducting Circuits for Quantum Computing," Fortschritte der Physik 48, pp. 1075-1094, 2000.

Tanaka et al., "DC SQUID Readout Readout For Qubit," Physica C, 3681300 304 (Mar. 2002).

Vion et al., "Manipulating the quantum state of an electrical circuit", Science, 296, pp. 886-889 (2002).

Yu et al., "Coherent temporal oscillations of macroscopic quantum states in a Josephson junction", Science, 296, pp. 889-892, 2002.

Zhang et al., "Substrate resonator for HTS rf SQUID operation", Physica C 372-3761282-286 (2002).

Zorin, "Quantum-Limited Electrometer Based on Single Cooper Pair Tunneling", Phys. Rev. Lett. 76, pp. 4408-4411, 1996.

Zorin, "Radio-Frequency Bloch-Transistor Electrometer", Phys. Rev. Lett. 86, pp. 3388-3391, 2001.

Zurek, "Decoherence and the transition from quantum to classical", Physics Today, 44, 10, pp. 36-44, 1991.

Boothby et al., "Architectural considerations in the design of a third-generation superconducting quantum annealing processor", arXiv:2108.02322v1, Aug. 2021, pp. 3-4; and figure 4.

Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.

International Search Report and Written Opinion for PCT/US2022/081515 dated Jan. 18, 2024, 9 pages.

International Search Report and Written Opinion for PCT/US2023/073045 dated Jan. 9, 2024 in 9 pages.

Ko, et al., "A Novel Method for Correcting Device Parameter Mismatches in Josephsen Junction Circuits", IEEE Transitions on Applied Superconductivity, vol. 3, No. 1. Mar. 1993, 4 pages.

Amin et al., "Current Biased Josephson Junction System," U.S. Appl. No. 60/557,747, filed Mar. 29, 2004, 49 pages.

Amin et al., "Degenerate Level Qubit Operations", U.S. Appl. No. 60/429,170, filed Nov. 25, 2002, 41 pages.

Ataides, et al., "the XZZX surface code", Nature Communications, https://doi.org/10.1038/s41467-021-22274-1,. 2021, 12 pages.

Augar et al., "Fault-tolerance thresholds for the surface code with fabrication errors", Phys. Rev. A 96 042316—Published Oct. 12, 2017, 4 pages.

Averin et al., "Variable Electrostatic Transformer: Controllable Coupling of Two Charge Qubits," Physical Review Letters 91(5): 057003-1-057003-4, Aug. 1, 2003.

Averin, D.V., "Adiabatic Quantum Computation with Cooper Pairs," arXiv:quant-ph/9706026v1, Jun. 13, 1997, 18 pages.

Barrett, et al., "Fault Tolerant Quantum Computation with Very High Threshold for Loss Errors", Phys. Rev. Lett. 105, Feb. 2005—Published Nov. 9, 2010, 4 pages.

Blais et al., "Tunable Coupling of Superconducting Qubits," arXiv:cond-mat/0207112v3 [cond-mat.mes-hall], Mar. 18, 2003, 4 pages.

Blatter et al., "Design aspects of superconducting-phase quantum bits," Physical Review B 63: 174511-1-174511-9, 2001.

Bocko et al., "Prospects for Quantum Coherent Computation Using Superconducting Electronics," IEEE Transactions on Applied Superconductivity 7(2):3638-3641, Jun. 1997.

Brown, et al., "A fault-tolerant non-Clifford gate for the surface code in two dimensions", Science Advances, May 22, 2020, vol. 6, Issue 21, 25 pages.

Calderbank, et al., "Good quantum error-correcting codes exist", Phys. Rev. A54, 1098—Published Aug. 1, 2996, 4 pages.

Clarke et al., "Superconducting quantum bits," Nature 453:1031-1042, Jun. 19, 2008.

Devoret et al., "Superconducting Circuits for Quantum Information: An Outlook," Science 339:1169-1174, Mar. 8, 2013.

Devoret et al., "Superconducting Qubits: A Short Review," arXiv:cond-mat/0411174v1, Nov. 7, 2004, 41 pages.

Feynman, "Simulating Physics with Computers," International Journal of Theoretical Physics 21(6/7): 467-488, 1982.

Fowler, et al., "Surface codes: towards practical large-scale quantum computation", Phys. Rev. A 86, 032324—Published Sep. 18, 2012, 5 pages.

Friedman et al., "Aharonov-Casher-Effect Suppression of Macroscopic Tunneling of Magnetic Flux," arXiv:cond-mat/0109544v1 [cond-mat.mes-hall], Sep. 28, 2001, 9 pages.

Friedman et al., "Quantum superposition of distinct macroscopic states," Nature 406:43-46, Jul. 6, 2000.

Grajcar et al. "Parametric Amplification for Quantum State Readout," U.S. Appl. No. 60/557,750, filed Mar. 29, 2004, 51 pages.

Harris et al., "Experimental Demonstration of a Robust and Scalable Flux Qubit," arXiv:0909.4321v1, Sep. 24, 2009, 20 pages.

Hilton et al., "Bus Architecture for Quantum Processing", U.S. Appl. No. 60/556,778, filled Mar. 26, 2004, 40 pages.

Horsman, et al., "Surface code quantum computing by lattice surgery", 2012 Journal of Physics, 14 123011, 28 pages.

Il'ichev et al., "Characterization and Measurement of Superconducting Structures", U.S. Appl. No. 60/341,974, filed Dec. 18, 2001, 22 pages.

Il'ichev et al., "Extra-Substrate Control System", U.S. Appl. No. 60/372,958, filed Apr. 15, 2002, 29 pages.

Johnson et al., "Scalable Control System for a Superconducting Adiabatic Quantum Optimization Processor," Superconductor Science & Technology (2010).

Knill, Fault-Tolerant Postselected Quantum Computation: Schemes, arXiv:quant-ph/0402171v1, Feb. 23, 2004, 17 pages.

Makhlin et al., "Quantum-state engineering with Josephson-junction devices," Reviews of Modern Physics 73 (2):357-400, Apr. 2001.

Martinis, "Superconducting phase qubits," Quantum Inf Process 8:81-103, 2009.

Mooij et al., "Josephson Persistent-Current Qubit," Science 285:1036-1039, Aug. 13, 1999.

Naaman et al., "On-Chip Josephson Junction Microwave Switch," Northrop Grumman Systems Corp., Baltimore, Maryland, USA, Dec. 7, 2015, 10 pages.

Nagayama, et al., "Sureface code error correction on a defective lattice", IOP Publishing, New J. Phys. 19 (2017) 29 pages.

Non Final Office Action for U.S. Appl. No. 16/996,355, mailed Oct. 17, 2022, 12 pages.

Orlando et al., "Superconducting persistent-current qubit," Physical Review B 60(22):15398-15413, Dec. 1, 1999.

Tang, et al., "Robust surface code topology against sparse fabrication defects in a superconducting-qubit array", Phys Rev. A 93. 032322—Published Mar. 15, 2018, 4 pages.

Venegas-Andraca, et al., "A cross-disciplinary introduction to quantum annealing-base algorithms", Contemporary Physics, Quantum Annealing ArXiv:1803.03372v1 [puant-ph] Mar. 9, 2018, 31 pages.

Wendin et al., "Superconducting Quantum Circuits, Qubits and Computing," arXiv:cond-mat/0508729v1 [cond-mat. supr-con], Aug. 30, 2005, 60 pages.

Zagoskin et al., "Two-Junction Phase Qubit", U.S. Appl. No. 60/349,663, filed Jan. 15, 2002, 21 pages.

Zagoskin et al., "Superconducting Qubits," La Physique au Canada 63(4):215-227, 2007.

Born , et al., "Fabrication of Ultrasmall Tunnel Junctions by Electron Beam Direct-Writing", IEEE, 2001, 4 pages.

Il'ichev, et al., "Nonsinusoidal Current-Phase Relationship of Grain Boundary Josephson junctions in High-Tc Superconductors", Physical Review Letters 81, 1998, 4 pages.

Benjamin, "Schemes for Parallel Quantum Computation Without Local Control of Qubits", arXiv:quant-ph/99099007v2, Sep. 18, 1999, 12 pages.

Benjamin, Quantum Computing Without Local Control of Qubit-Qubit Interactions, 2001, 4 pages.

Bravyi, et al., "Hight-threshold and low-overhead fault-tolerant quantum memory", arXiv:2308.07915v1 [quant-ph] Aug. 15, 2023, 38 pages.

Bravyi, et al., "Universal quantum computation with ideal Clifford gates and noisy ancillas", arXiv:quant-ph/0403025v2 Dec. 16, 2004, 15 pages.

(56) References Cited

OTHER PUBLICATIONS

Carelli et al., "SQUID Systems for Macroscopic Quantum Coherence and Quantum Computing", IEEE trans. Apple. Supercond., Mar. 1, 2001. https://ieeexplore.ieee.org/document/919321.

Chamberland et al., "Building A Fault-Tolerant Quantum Computer Using Concatenated Cat Codes", arXiv:2012.04108v2 [quant-ph] Jan. 27, 2022,117 page.

Cosmelli et al., "An Integrated System of SQUIDs for the Study of Macroscopic Quantum Coherence", Supercond. Sci. Technol. 14, 2001.

Gottesman, et al., "Stabilizer Codes and Quantum Error Correction", arXiv:quant-ph/9705052v1, May 28, 1997, 122 pages.

Harris et al., 'A Compound Josephson Junction Coupler for Flux Qubits With Minimal Crosstalk', arXiv:0904.3784v3, Jul. 2009.

International Search Report and Written Opinion for PCT/US2022/012000 mailed Apr. 21, 2022, 11 pages.

Litinski, et al., "A Game of Surface Codes: Large-Scale Quantum Computing with Lattice Surgery", arXuv:1808.0289.02892v3 [quant=ph] Feb. 3, 2019, 37 pages.

Mizuta, et al., "Quantum and Tunnelling Capacitance in Charge and Spin Qubits", arXiv:1604.02884v2 [cond-mat.mes-hall] Aug. 16, 2016, 9 pages.

Neill, "A path towards quantum supremacy with superconducting qubits", PHD Thesis—University of California, Dec. 1, 2017.

Neven, "Suppressing quantum errors by scaling a surface code logical qubit", arXiv:2207.06431v1 [quant-ph] Jul. 13, 2022, 44 pages.

Nguyen et al., "Scalable High-Performance Fluxonium Quantum Processor", arXiv:2201.09374v2 [quant-ph] Feb. 5, 2022, 29 pages.

Orlando et al, "Flux-based Superconducting Qubits for Quantum Computation" Physica C 372-376, 194-200, 2002.

Ortlepp et al., "Access Time and Power Dissipation of a Model 256-Bit Single Flux Quantum RAM", IEEE Transactions on Applied Superconductivity, vol. 24, No. 4, Aug. 2014.

Ortlepp et al., "Design Guidelines for Suzuki Stacks as Reliable High-speed Josephson Voltage Drivers", Superconductor Science Technology, 26 (2013) 035007 (12pp).

Raussendorf, et al., "Fault-Tolerant quantum computation with high threshold in two dimensions", arXiv:quant-ph/0610082v2, May 14, 2007, 4 pages.

Tokunaga et al., "SiO2 passivation film effects on YBCO junctions", Science Direct, Sep. 10, 1998.

Yamamoto, "Flux Driven Josephson Parametric Amplifier", arXiv:0808.1386v1 [cond-mat.supr-con] 2008.

Yan et al., "A tunable coupling scheme for implementing high-fidelity two-qubit gates", Arxiv: 1803.09813v1, Mar. 26, 2018.

Abrams et al., "A quantum algorithm providing exponential speed increase for finding eigenvalues and eigenvectors," arXiv:quant-ph/9807070v1, Jul. 24, 1998, 9 pages.

Abrams et al., "Simulation of Many-Body Fermi Systems on a Universal Quantum Computer," arXiv:quant-ph/9703054, Mar. 28, 1997, 10 pages.

Alange et al., "Superconducting Material Diagnostics using a scanning Near-field Microwave Microscope", Los Alamos National Laboratory pre-print cond-met/9811158, pp. 1-6, 1998.

Alff et al, "Magnetic Field Effect three terminal device based on YBs2Cu3O7-x grain boundary junction", Journal of Applied Physics, 75, pp. 1843-1845, 1944.

Barenco et al., "Elementary gates for quantum computation," Physical Review A 52(5):3457-3467, Nov. 1995.

Beasley et al., "Time-reversal Symmetry breaking in superconductors: A proposed Experimental test", Physical Review B, 49, p. 12330-12332, 1994.

Berkley et al., "Systems and Methods for Operating a Quantum Processor to Determine Energy Eigenvalues of a Hamiltonian," USAN U.S. Appl. No. 61/832,645, filed Jun. 7, 2013, 51 pages.

Blamonte et al., "Realizable Hamiltonians for universal adiabatic quantum computers," arXiv:0704.1287v2, Jun. 17, 2008, 7 pages.

Blais et al., "Operation of universal gates in a solid-state quantum computer based on clean Josephson junctions between d-wave superconductors", Physical Review A, 61, 042308, 2000.

Blatter et al., "Engineering Superconducting Phase Qubits", Los Alamos National Laboratory pre-print cond-met/9912163, 1999.

Bravyi et al., "The Complexity of Stoquastic Local Hamiltonian Problems," arXiv:quant-ph/0606140v4, Oct. 2, 2007, 21 pages.

Chapman et al., "General Purpose Multiplexing Device for Cryogenic Microwave Systems," arXiv: 1603.02716v2 [quant-ph] May 31, 2016, 10 pages.

Deutsch, "Quantum theory, the Church-Turing principle and the universal quantum computer," Appeared in Proceedings of the Royal Society of London A 400: 97-117, 1985.

Dimoulas et al., "Phase-dependent resistance in a superconductor two dimensional electron gas quasiparticle interferometer", Physical Review Letters, 74, pp. 602-605, 1995.

DiVincenzo, "The Physical Implementation of Quantum Computation," Fortschr. Phys. 48:771-783, 2000.

Flory et al., "Metallic and superconducting surfaces of YBa2Cu3O7 probrd by electrostatic charge modulation of epitaxial films", Physical Review Letters, 65, pp. 3441-3444, 1990.

Frey et al., "Mechanism of the electric field effect in the high Tc couprates", Physical Review B, 51, pp. 3257-3260, 1995.

Geim et al., "Ballistic Hall micromagnetometry", Applied Physics Letters, 71, pp. 2379-2381, 1997.

Han et al., "Time-Resolved Measurement of Dissipation-Induced Decoherence in a Josephson Junction," Science 293:1457-1459, Aug. 24, 2001.

Harris et al., "Universal Adiabatic Quantum Computing With Superconducting Qubits," U.S. Appl. No. 61/894,267, filed Oct. 22, 2013, 44 pages.

Hartog et al., "Transport in Multiterminal Normal Superconductor Devices: reciprocity relations, Negative and nonlocal resistances, and reentrance of the Proximity Effect", Physical Review Letters, 77, pp. 4954-4957, 1996.

International Search Report & Written Opinion (PCT/US2020/065150)—Apr. 13, 2021.

Ivanov et al., "Field effect transistor based on a bi-crystal boundary Josephson Junction", IEEE Transactions on Applied Superconductivity, 3, pp. 2925-2928, 1993.

Ivanov et al., "Three terminal Josephson Junction with a Semiconductor Accumulation Layer", Japanese Journal of Applied Physics, 26, supplement 3, pp. 1617, 1987.

James et al., "Scanning Hall probe Microscope images of Field penetration into niobium fields", Physica C 332, pp. 445-449, 2000.

Jiang et al., "New FET using the superconducting phase transition of a high temperature oxide superconductor", Superconductor Science and Technology, 4, pp. 466-470, 1991.

Jones et al., Tunable electromagnetic environment for supercomputing, Jun. 13, 2013, Scientific Reports, pp. 1-5 (Year:2013).

Kirtley et al., "Direct Imaging of Integer and Half-Integer Josephson Junction Vortices in High Tc Grain Boundaries", Physical Review Letters, 76, pp. 1336-1339, 1996.

Lombardi et al., "Transport and structural properties of the top and bottom grain boundaries on YBa2Cu3O7 step edge Josephson Junctions", Applied Physics Letters, 72, pp. 249-251, 1998.

Mannhart et al., "Anomalous dependence of the critical current of 45 grain boundaries in YBa2Cu3O7-x on an applied magnetic field", Zeitschrift fur Physik B, 101, pp. 175-179, 1996.

Mannhart et al., "High-Tc transistors", Superconductor Science and Technology, 9, pp. 49-67, 1996.

Mannhart et al., "Influence of electric fields on pinning in YBa2Cu3O7 films", Physical Review Letters, 67, pp. 2099-2101, 1991.

Mannhart et al., "Large electric field effetos in YBa2Cu3O7 films containing weak links", Applied Physics letters, 62, pp. 630-632, 1992.

Martinis et al., "Rabi Oscillations in a Large Josephson-Junction Qubit," Physical Review Letters 89(11): 117901-1-117901-4, Sep. 9, 2002.

Nakajima et al., "Field Effects on the dielectric property of YBCO bicrystal grain boundary junctions", IEEE Transactions on Applied Superconductivity, 5, pp. 2861-2863, 1995.

(56) References Cited

OTHER PUBLICATIONS

Nakamura et al., "Coherent control of macroscopic quantum states in a single-Cooper-pair-box," Nature 398:786-788, Apr. 29, 1999.

Oral et al., "Microscopic measurements of penetration depth in YBa2Cu3O7-d thin films by scanning Hall probe microscopy", Superconductor Science and Technology 10, pp. 17-20, 1997.

Oral et al., "Real time scanning Hall probe microscopy", Applied Physics Letters, pp. 1324-1326, 1996.

Pechal et al., "Superconducting Switch for Fast On-Chip Routing of Quantum Microwave Fields," arXiv:1606.01031v1 [quant-ph] Jun. 3, 2016, 8 pages.

Tsuei et al., "Pairing symmetry in flux quantization in a tricrystal superconducting ring Yba2Cu3O7-delta", Physical Review Letters, 73, pp. 593-596, 1994.

Tzalenchuk et al., "SQUID and Hall-probe microscopy of superconducting films", IOP conference series 167, pp. 581-584, 2000.

Japanese First Office Action for Japanese patent Application No. 2022-538141, dated Sep., 17, 2024, 6 pages (including translation).

Japanese Second Office Actoin for Japanese Patent Application No. 2022-538141, dated Dec. 18, 2024, 4 pages (including translation).

Harris, Experimental Demonstration of a Robust and Scalable Flux Qubit, arXiv:0909.4321v1 [cond-mat.supr-con], Sep. 24, 2009, 20 pages [cited in earlier IDS dated Oct. 27, 2022].

Chinese First Office Action for Chinese Patent Application No. 202080097220.4, dated Jul. 28, 2025, 13 pages (including translation).

\* cited by examiner

100a

100b

600

602 — Determine total inductance change ΔL

604 — Determine total capacitance change ΔC

606 — Distribute ΔL between inductors based on ΔC

608 — Tune inductors based on distribution

SYSTEMS AND METHODS FOR TUNING CAPACITANCE OF QUBITS

FIELD

This disclosure generally relates to analog computing, and particularly to the design and operation of devices for tuning the physical characteristics of quantum devices.

BACKGROUND

Quantum Devices

Quantum devices are structures in which quantum mechanical effects are observable. Quantum devices include circuits in which current transport is dominated by quantum mechanical effects. Such devices include spintronics, where electronic spin is used as a resource, and superconducting circuits. A superconducting circuit is a circuit that includes a superconducting device. A superconducting device is a device that includes a superconducting material. A superconducting material is a material that has no electrical resistance below critical levels of current, magnetic field and temperature. Both spin and superconductivity are quantum mechanical phenomena. Superconductivity is a physical phenomenon that was well known in the art at the time of filing of the present application. Quantum devices can be used for measurement instruments, in computing machinery, and the like.

Quantum Computation

Quantum computation and quantum information processing are active areas of research and define classes of vendible products. A quantum computer is a system that makes direct use of at least one quantum-mechanical phenomenon, such as, superposition, tunneling, and entanglement, to perform operations on data. The elements of a quantum computer are quantum binary digits, known as qubits. Quantum computers hold the promise of providing exponential speedup for certain classes of computational problems such as computational problems simulating quantum physics. Useful speedup may exist for other classes of problems.

One model of quantum computing is adiabatic quantum computing. Adiabatic quantum computing can be suitable for solving hard optimization problems, for example. Further details on adiabatic quantum computing systems, methods, and apparatus are described, for example, in U.S. Pat. Nos. 7,135,701 and 7,418,283.

Quantum Annealing

Quantum annealing is a computational method that may be used to find a low-energy state of a system, typically preferably the ground state of the system. Similar in concept to classical simulated annealing, the method relies on the underlying principle that natural systems tend towards lower energy states because lower energy states are more stable. While classical annealing uses classical thermal fluctuations to guide a system to a low-energy state, quantum annealing may use quantum effects, such as quantum tunneling, as a source of delocalization to reach an energy minimum more accurately and/or more quickly than classical annealing. In quantum annealing, thermal effects and other noise may be present. The final low-energy state may not be the global energy minimum.

Adiabatic quantum computation may be considered a special case of quantum annealing. In adiabatic quantum computation, the system ideally begins and remains in its ground state throughout an adiabatic evolution. Thus, those of skill in the art will appreciate that quantum annealing systems and methods may generally be implemented on an adiabatic quantum computer. Throughout the present application, any reference to quantum annealing is intended to encompass adiabatic quantum computation unless the context requires otherwise.

Superconducting Qubits

A quantum processor can be a superconducting quantum processor that includes superconducting qubits. Wendin G. and Shumeiko V. S., "SUPERCONDUCTING QUANTUM CIRCUITS, QUBITS AND COMPUTING" (arXiv:cond-mat/0508729v1, 2005), provides an introduction to the physics and principles of operation of quantized superconducting electrical circuits for quantum information processing.

Coupling

Couplers can provide communicative coupling between quantum devices in a quantum processor. Coupling can be, for example, between adjacent and/or non-adjacent qubits. Unless expressly indicated otherwise, as used herein and in the claims, the terms couple, couples, coupling and variations of such means direct or indirect communicative coupling or communications between two or more components.

Tuning Qubit Characteristics

Quantum devices, such as qubits and couplers, may possess various characteristics, such as flux, persistent current, inductance, capacitance, and so on. Such characteristics can affect the results of quantum computations performed by such qubits, and so it can be desirable to tune one or more of those characteristics to align with the parameters of a given computation. Example systems and methods for tuning qubit characteristics, including example qubits and couplers, are provided by U.S. Pat. Nos. 8,536,566 and 9,152,923 and PCT Application No. US2018/066613.

It is advantageous for qubits in an analog computing system, such as a quantum processor, to possess identical (or approximately identical) properties such as inductance and capacitance. This assists in accurately mapping from a problem (e.g. represented as a Hamiltonian) onto a physical analog processor. To that end, some analog processors include a device called an L-tuner for tuning the inductance of a qubit (e.g. as described by U.S. Pat. No. 8,536,566). Adding a "C-tuner" for tuning capacitance has proved challenging due to various factors, such as structural complexity, consequent bandwidth limitations, interference with flux qubit eigenstates, operational flexibility, and/or other factors. There thus continues to be a desire for systems and methods for tuning capacitance of qubits.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

Aspects of the present disclosure provide an analog computing system comprising a qubit. The qubit comprises a qubit loop formed by a first superconducting current path and at least one Josephson junction interrupting the qubit loop. The at least one Josephson junction has a critical distance such that adding a lumped inductance nearer than the critical distance to the at least one Josephson junction along the qubit loop decreases a qubit capacitance at the at least one Josephson junction and adding the lumped inductance further than the critical distance from the at least one Josephson junction along the qubit loop increases the qubit capacitance. The qubit further comprises a plurality of inductors disposed along the qubit loop. Each of the plurality of inductors is tunable to provide a tunable inductance. The plurality of inductors comprises one or more near inductors, each near inductor disposed along the qubit loop less than the critical distance from the at least one Josephson junction, and one or more far inductors, each far inductor disposed along the qubit loop more than the critical distance from the at least one Josephson junction.

In some implementations, the analog computing system comprises one or more couplers tunably coupleable to the qubit loop. Each of the one or more couplers is tunable to provide a respective coupling strength with the qubit.

In some implementations, the tunable inductance for each of the plurality of inductors is tunable within a corresponding inductance range and each of the one or more couplers has a corresponding coupler-induced inductance range, each coupler-induced inductance range comprising a difference in a qubit inductance at the at least one Josephson junction between states of the corresponding one of the one or more couplers, and a sum of the tunable inductance ranges of the plurality of inductors is greater than each of the corresponding coupler-induced inductance ranges.

In some implementations, one inductor of the plurality of inductors comprises one or more inductor Josephson junctions interrupting the qubit loop and tunable to provide a respective tunable inductance range of the one inductor of the plurality of inductors. In some implementations, the one of the plurality of inductors comprises one or more DC-SQUIDs, the one or more DC-SQUIDs comprising the one or more inductor Josephson junctions. In some implementations, the one of the plurality of inductors comprises a plurality of DC-SQUIDs connected in series along the qubit loop.

In some implementations, the sum of the tunable inductance ranges of the plurality of inductors is greater than a total coupler-induced inductance range, the total coupler-induced inductance range comprising a difference between a first coupler-induced inductance and a second coupler-induced inductance, the first coupler-induced inductance comprising the qubit inductance in a first state where each of the one or more couplers is ferromagnetically coupled to the qubit and the second coupler-induced inductance comprising the qubit inductance in a second state where each of the one or more couplers is anti-ferromagnetically coupled to the qubit.

In some implementations, the one or more near inductors collectively are tunable to reduce the qubit capacitance from a first coupler-induced capacitance to within a first threshold of a target capacitance; and the one or more far inductors collectively are tunable to increase the qubit capacitance from a second coupler-induced capacitance to within a second threshold of the target capacitance.

In some implementations, the first coupler-induced capacitance comprises the qubit capacitance in a third state where each of the one or more couplers that is nearer to the at least one Josephson junction along the qubit loop than the critical distance, if any, is anti-ferromagnetically coupled to the qubit loop and each of the one or more couplers that is farther from the at least one Josephson junction along the qubit loop than the critical distance, if any, is ferromagnetically coupled to the qubit loop; and the second coupler-induced capacitance comprises the qubit capacitance in a fourth state where each of the one or more couplers that is nearer to the at least one Josephson junction along the qubit loop than the critical distance, if any, is ferromagnetically coupled to the qubit loop and each of the one or more couplers that is farther from the at least one Josephson junction along the qubit loop than the critical distance, if any, is anti-ferromagnetically coupled to the qubit loop.

In some implementations, for a predetermined target qubit inductance and a predetermined set of coupling strengths for the one or more couplers, the plurality of inductors are tunable to provide a total tunable inductance for each of the first, second, third, and fourth states which increases the qubit inductance to within a third threshold of the predetermined target qubit inductance and at least one of: increases and reduces the qubit capacitance to within a fourth threshold of the target capacitance.

In some implementations, the qubit comprises a second qubit loop, the at least one Josephson junction interrupting the second qubit loop; and at least one secondary inductor disposed along the second qubit loop. In some implementations, the qubit loop and second qubit loop partially overlap along a shared portion and a shared inductor of the plurality of inductors is disposed along the shared portion. In some implementations, the shared inductor comprises one of the one or more near inductors.

In some implementations, the at least one secondary inductor comprises one or more secondary near inductors, each secondary near inductor disposed along the second qubit loop less than a second critical distance from the at least one Josephson junction; and one or more secondary far inductors, each secondary far inductor disposed along the second qubit loop more than the second critical distance from the at least one Josephson junction. In some implementations, the plurality of inductors and the at least one secondary inductor collectively provide a collective tunable inductance range of at least twice a total coupler-induced inductance range.

Aspects of the present disclosure provide systems and methods for tuning an effective capacitance of a qubit in an analog computing system. The method is performed by a processor in communication with the analog computing system (e.g., by executing at least one of processor-executable instructions or data stored by at least one nontransitory processor-readable storage medium) and comprises determining a predicted capacitance for the qubit, determining a target capacitance for the qubit, determining a total capacitance change $\Delta C$ based on the target and predicted capacitances, and tuning a plurality of inductors. Each inductor is disposed at a corresponding distance from one or more Josephson junctions of the qubit along a qubit loop and is tuned to change the effective capacitance of the qubit based on the corresponding distances from the one or more Josephson junctions and the total capacitance change.

In some implementations, the one or more Josephson junctions have a critical distance such that adding a lumped inductance nearer than the critical distance to the one or more Josephson junctions along the qubit loop decreases a qubit capacitance at the one or more Josephson junctions and adding the lumped inductance further than the critical distance from the one or more Josephson junctions increases the qubit capacitance. In some implementations, tuning a plurality of inductors comprises tuning a first inductor of the plurality of inductors that is nearer to the one or more Josephson junctions than the critical distance along the qubit loop to decrease the qubit capacitance; and tuning a second inductor of the plurality of inductors that is farther from the one or more Josephson junctions along the qubit loop than the critical distance to increase the qubit capacitance.

In some implementations, tuning the plurality of inductors based on the corresponding distances from the one or more Josephson junctions comprises tuning the first and second inductors based on the first and second inductors' respective distances from a point disposed at the critical distance along the qubit loop from the one or more Josephson junctions.

In some implementations, the method comprises determining a predicted inductance for the qubit; determining a target inductance for the qubit; and determining a total inductance change $\Delta L$ based on the target and predicted inductances. In some implementations, tuning the plurality of inductors to change the effective capacitance of the qubit comprises tuning the plurality of inductors so that a sum of a corresponding plurality of tunable inductances of the plurality of inductors is within a threshold of a total inductance change $\Delta L$ and tuning the plurality of inductors so that the sum of the plurality of tunable inductances is distributed between the plurality of inductors based on the total capacitance change $\Delta C$.

In some implementations, tuning the plurality of inductors so that the sum of the plurality of tunable inductances is distributed between the plurality of inductors based on the total capacitance change $\Delta C$ comprises tuning the tunable inductance of the first inductor of the plurality of inductors to reduce the effective qubit capacitance and increase an effective qubit inductance; and tuning the tunable inductance of the second inductor of the plurality of inductors to increase the effective qubit capacitance and increase the effective qubit inductance.

In some implementations, tuning the plurality of inductors so that the sum of the plurality of tunable inductances is distributed between the plurality of inductors based on the total capacitance change $\Delta C$ comprises selecting, from a plurality of candidate distributions of inductor tuning values, a selected distribution based on the total capacitance change $\Delta C$ and the total inductance change $\Delta L$; and tuning the plurality of tunable inductors based on the inductor tuning values of the selected distribution.

In some implementations, each candidate distribution corresponds to a candidate capacitance change and selecting the selected distribution comprises selecting the selected distribution based on a difference between the candidate capacitance change and the total capacitance change $\Delta C$.

In some implementations, tuning the plurality of tunable inductors based on the selected distribution comprises interpolating an interpolated inductor tuning value for each of the plurality of inductors based on the inductor tuning values of the selected distribution and the inductor tuning values of an additional one of the plurality of candidate distributions; and tuning the plurality of tunable inductors based on the interpolated inductor tuning values.

In some implementations, identifying the plurality of candidate distributions comprises identifying the plurality of candidate distributions in a lookup table based on at least one of the total capacitance change $\Delta C$ and the total inductance change $\Delta L$; and wherein the additional one of the plurality of candidate distributions is proximate to the selected distribution in the lookup table.

In some implementations, identifying the plurality of candidate distributions of inductor tuning values comprises looking up a first set of inductor tuning values for one of the first and second inductors along a first axis of a lookup table and identifying for each of the first set of inductor tuning values a corresponding inductor tuning value for an additional one of the first and second inductors along a second axis of the lookup table such that the sum of the first and second inductor tuning values are within a threshold of the total inductance change $\Delta L$, each inductor tuning value from the first set paired with the corresponding inductor tuning value for the additional one of the first and second inductors comprising a candidate distribution and corresponding to a predicted capacitance change.

In some implementations, selecting a selected distribution from the plurality of candidate distributions comprises selecting the candidate distribution with a corresponding predicted capacitance change nearest to the total capacitance change $\Delta C$ among the plurality of candidate distributions.

In some implementations, tuning the plurality of inductors so that the sum of the plurality of tunable inductances is distributed between the plurality of inductors based on the total capacitance change $\Delta C$ comprises looking up the total capacitance change $\Delta C$ along a first axis of a lookup table; looking up the total inductance change $\Delta L$ along a second axis of the lookup table; identifying a candidate distribution of inductor tuning values in the lookup table corresponding to the total capacitance change $\Delta C$ and total inductance change $\Delta L$; and tuning the plurality of inductors based on the candidate distribution.

In some implementations, looking up at least one of the total capacitance change $\Delta C$ and total inductance change $\Delta L$ comprises determining an entry along at least one of the first and second axes of the lookup table approximating the at least one of the total capacitance change $\Delta C$ and total inductance change $\Delta L$.

In some implementations, tuning a plurality of inductors comprises tuning a first inductor at a first distance from the one or more Josephson junctions along the qubit loop to reduce the effective qubit capacitance and increase an effective qubit inductance; and tuning a second inductor at a second distance from the one or more Josephson junctions along the qubit loop to increase the effective qubit capacitance and increase an effective qubit inductance, the second distance greater than the first distance.

In some implementations, determining a predicted capacitance for the qubit comprises determining a coupler-induced capacitance load based on one or more coupling strengths of one or more couplers coupled to the qubit.

In some implementations, tuning the plurality of inductors to change the effective capacitance of the qubit based on the total capacitance change comprises tuning the plurality of inductors to compensate for the coupler-induced capacitance load.

Aspects of the present disclosure provide a computational system comprising at least one processor in communication with an analog processor having at least one qubit and at least one nontransitory processor-readable storage medium that stores at least one of processor-executable instructions or data which, when executed by the at least one processor cause the at least one processor to perform actions comprising determining a predicted capacitance for the qubit, determining a target capacitance for the qubit, determining a total capacitance change $\Delta C$ based on the target and predicted capacitances, and causing the analog processor to tune a plurality of inductors, each inductor disposed at a corresponding distance from one or more Josephson junctions of the qubit along a qubit loop, to change the effective capacitance of the qubit based on the corresponding distances from the one or more Josephson junctions and the total capacitance change.

In some implementations, the actions may further comprise determining a predicted inductance for the qubit, determining a target inductance for the qubit, and determining a total inductance change $\Delta L$ based on the target and predicted inductances. Tuning the plurality of inductors to change the effective capacitance of the qubit may comprise tuning the plurality of inductors so that a sum of a corresponding plurality of tunable inductances of the plurality of inductors is within a threshold of the total inductance change ΔL and tuning the plurality of inductors so that the sum of the plurality of tunable inductances is distributed between the plurality of inductors based on the total capacitance change ΔC.

In some implementations, tuning the plurality of inductors based on the corresponding distances from the one or more Josephson junctions may comprise tuning a first inductor and a second inductor based on the respective distances of the first and second inductors from a point disposed at a critical distance along the qubit loop from the one or more Josephson junctions. Tuning the plurality of inductors so that the sum of the plurality of tunable inductances is distributed between the plurality of inductors based on the total capacitance change ΔC may comprise tuning the tunable inductance of the first inductor to reduce the effective qubit capacitance and increase an effective qubit inductance and tuning the tunable inductance of the second inductor to increase the effective qubit capacitance and increase the effective qubit inductance.

In some implementations, tuning the plurality of inductors so that the sum of the plurality of tunable inductances is distributed between the plurality of inductors based on the total capacitance change ΔC may comprises selecting, from a plurality of candidate distributions of inductor tuning values, a selected distribution based on the total capacitance change ΔC and the total inductance change ΔL and tuning the plurality of tunable inductors based on the inductor tuning values of the selected distribution. Selecting the selected distribution may comprise selecting the selected distribution based on a difference between a candidate capacitance change corresponding to the selected distribution and the total capacitance change ΔC.

In some implementations, tuning the plurality of tunable inductors based on the selected distribution may comprise interpolating an interpolated inductor tuning value for each of the plurality of inductors based on the inductor tuning values of the selected distribution and the inductor tuning values of an additional one of the plurality of candidate distributions and tuning the plurality of tunable inductors based on the interpolated inductor tuning values. Identifying the plurality of candidate distributions may comprise identifying the plurality of candidate distributions in a lookup table based on at least one of the total capacitance change ΔC and the total inductance change ΔL; and wherein the additional one of the plurality of candidate distributions is proximate to the selected distribution in the lookup table. Identifying the plurality of candidate distributions of inductor tuning values may comprise looking up a first set of inductor tuning values for one of the first and second inductors along a first axis of a lookup table and identifying for each of the first set of inductor tuning values a corresponding inductor tuning value for an additional one of the first and second inductors along a second axis of the lookup table such that the sum of the first and second inductor tuning values are within a threshold of the total inductance change ΔL, each inductor tuning value from the first set paired with the corresponding inductor tuning value for the additional one of the first and second inductors comprising a candidate distribution and corresponding to a predicted capacitance change.

In some implementations, selecting a selected distribution from the plurality of candidate distributions may comprise selecting the candidate distribution with a corresponding predicted capacitance change nearest to the total capacitance change ΔC among the plurality of candidate distributions. Tuning the plurality of inductors so that the sum of the plurality of tunable inductances is distributed between the plurality of inductors based on the total capacitance change ΔC may comprise looking up the total capacitance change ΔC along a first axis of a lookup table, looking up the total inductance change ΔL along a second axis of the lookup table, identifying a candidate distribution of inductor tuning values in the lookup table corresponding to the total capacitance change ΔC and total inductance change ΔL, and tuning the plurality of inductors based on the candidate distribution. Looking up at least one of the total capacitance change ΔC and total inductance change ΔL may comprise determining an entry along at least one of the first and second axes of the lookup table approximating the at least one of the total capacitance change ΔC and total inductance change ΔL.

In some implementations, tuning a plurality of inductors may comprise tuning a first inductor at a first distance from the one or more Josephson junctions along the qubit loop to reduce the effective qubit capacitance and increase an effective qubit inductance and tuning a second inductor at a second distance from the one or more Josephson junctions along the qubit loop to increase the effective qubit capacitance and increase an effective qubit inductance, the second distance greater than the first distance. Determining a predicted capacitance for the qubit may comprise determining a coupler-induced capacitance load based on one or more coupling strengths of one or more couplers coupled to the qubit. Tuning the plurality of inductors to change the effective capacitance of the qubit based on the total capacitance change may comprise tuning the plurality of inductors to compensate for the coupler-induced capacitance load.

Aspects of the present disclosure provide an analog computing system comprising a qubit, the qubit comprising a Josephson junction, a first qubit loop formed by a first superconducting current path, and a second qubit loop formed by a second superconducting current path, wherein the first qubit loop and the second qubit loop are electrically connected in parallel across the Josephson junction.

In some implementations, the analog computing system may further comprise a first flux bias line in communication with the first qubit loop and a second flux bias line in communication with the second qubit loop, the first flux bias line receiving signals independently from the second flux bias line. The second qubit loop may comprise a first portion in communication with the Josephson junction and a second portion spaced from the Josephson junction, the first portion and the second portion being separated by a crossing, wherein a current in the second qubit loop travels in a first rotational direction in the first portion and a second rotational direction that is opposite to the first rotational direction in the second portion.

In some implementations, the Josephson junction may comprise one of a compound Josephson junction or a compound-compound Josephson junction. The first qubit loop and the second qubit loop may partially overlap along a shared portion. The analog computing system may further comprise a coupler tunably coupled to one of the first qubit loop and the second qubit loop. The analog computing system may further comprise a second qubit coupled to the coupler. The first qubit loop and the second qubit loop may be symmetric about an axis of the Josephson junction, the axis of the Josephson junction intersecting a first connection between the first qubit loop and the second qubit loop and the Josephson junction and a second connection between the first qubit loop and the second qubit loop and the Josephson junction.

In some implementations, the analog computing system may further comprise one or more additional qubit loops electrically connected in parallel across the Josephson junction. The analog computing system may also further comprise a plurality of inductors disposed along each of the first qubit loop and the second qubit loop, each of the plurality of inductors being tunable to provide a corresponding tunable inductance.

In other aspects, the features described above may be combined in any reasonable combination as will be recognized by those skilled in the art.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

L-Tuner

Figure 1A:
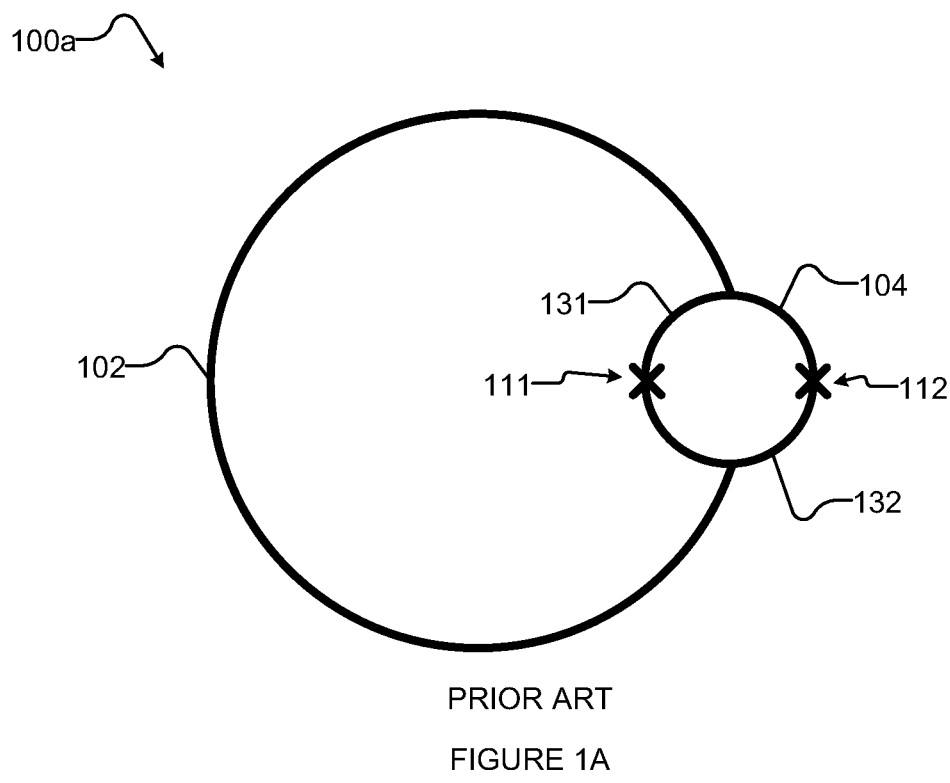
FIG. 1A is a schematic diagram of a prior art qubit.

FIG. 1A is a schematic diagram of a superconducting flux qubit 100a. Qubit 100a comprises a qubit loop 102 (e.g., a loop of superconducting material) that is interrupted by one or more Josephson junctions. In the exemplary implementation of FIG. 1A, qubit loop 102 is interrupted by a compound Josephson junction 104 (also called a "CJJ") comprising current paths 131, 132, each of which is interrupted by a respective Josephson junction 111, 112.

Figure 1B:
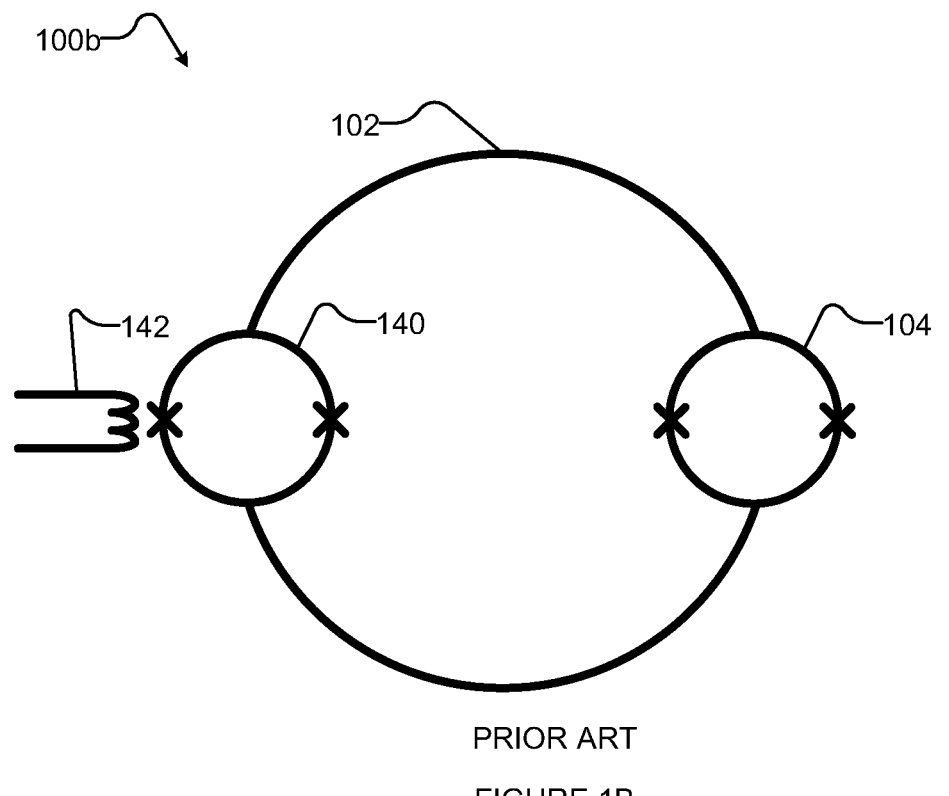
FIG. 1B is a schematic diagram of a prior art qubit with an inductance tuner.

FIG. 1B is a schematic diagram of a superconducting flux qubit 100b. Qubit 100b comprises qubit loop 102 and compound Josephson junction 104, substantially similarly to qubit 100a. Qubit 100b further comprises an inductance tuner 140 (or "L-tuner") which provides a tunable inductance to qubit 100b. Inductance tuner 140 may comprise, for example, a CJJ connected in series with compound Josephson junction 104 in qubit loop 102. As described, for example, in U.S. Pat. No. 9,152,923, inductance tuner 140 may be tuned using a programmable interface 142, such as by inductively and/or galvanically coupling control signals to inductance tuner 140 and thus tuning the Josephson inductance of compound Josephson junction 140 and, by extension, of qubit 100b.

Qubits 100a and 100b may be coupled to other devices inductively or otherwise. For example, in some implementations qubits 100a and 100b are inductively coupled to other qubits via inter-qubit couplers (not shown). Such couplings can affect the electromagnetic properties of qubits 100a, 100b. For example, the capacitance of qubit 100b may be a complex function of both coupler and L-tuner settings. Although in the past this effect has been small enough to ignore in practice, as quantum processors scale up experiments have shown that the effect increases. For example, in some implementations tuning both couplers and L-tuners can cause changes in qubit capacitance on the order of 10 fF, potentially causing errors in calibration, coupler-dependent desynchronization of qubit dynamics, and other difficult-to-address behaviour.

Split L-Tuner

The effect of a lumped inductance on capacitance, such as that contributed by an L-tuner, varies with not only the scale of the inductance but also the position at which the lumped inductance is disposed along the qubit loop relative to one or more Josephson junctions that form part of the qubit. For example, an inductor coupled in series to (and positioned near to) the one or more Josephson junctions and possessing inductance $L_{near}$ can give rise to an effective qubit capacitance modeled as follows:

$$C_{\text{eff}} = \frac{L_Q^2}{3(L_Q + L_{near})} C_Q$$

where $L_Q = L_U \times L$, $C_Q = C_U \times L$, $L$ is the length of the qubit loop, $L_U$ is the intrinsic inductance of the qubit loop per unit length, and $C_U$ is the intrinsic capacitance of the qubit loop per unit length. An inductor positioned farther away from the one or more Josephson junctions, e.g., at an opposing end of the qubit loop that forms part of the qubit, and possessing inductance $L_{far}$ can give rise to an effective qubit capacitance $C_{\text{eff}}$ measured at the one or more Josephson junctions which can be modeled as follows:

$$C_{\text{eff}} = \frac{L_Q^2 + 3L_Q(L_Q + L_{far})}{3(L_Q + L_{far})^2} C_Q.$$

When $L_{near} = L_{far} = 0$, both models yield $C_{\text{eff}} = C_Q/3$, which is the expected capacitance of a shorted loop (the 1/3 factor arises from input impedance). However, in the case of $L_{near} > 0$, the resulting $C_{\text{eff}}$ will be less than the expected $C_Q/3$. That is, increasing the inductance of the near inductor causes a reduction of effective qubit capacitance. The near inductor can thus be thought of as blocking a portion of the superconducting loop's intrinsic capacitance from being observed at the one or more Josephson junctions. The far inductor, however, can have an opposing effect; $C_{\text{eff}}$ tends to increase as $L_{far}$ increases.

Note that the capacitance-reducing behavior of the near inductor can be dominated by other dynamics if $L_{near}$ is sufficiently large, potentially resulting in an increase to the effective qubit capacitance $C_{\text{eff}}$. However, it has been determined through experiment that the near inductor's capacitance-reducing behavior can extend well beyond a typical programmable range for suitably positioned/scaled near inductors. (Herein, an inductor's "scale" refers to those structural features which dictate the amount of inductance that the inductor can contribute to qubit 201. For example, the scale of example inductor 206 may be at least partially determined by the size of its constituent Josephson junctions, with smaller Josephson junctions (e.g., with smaller area) generally corresponding to more inductance and thus greater scale. For some inductors, such as spiral inductors, larger area generally corresponds to more inductance and thus greater scale.)

Aspects of the present disclosure provide analog computing systems comprising a qubit which are advantageously provided with a plurality of tunable inductors, including inductors exhibiting the capacitance-reducing behavior described above with reference to $L_{near}$ (these are denominated herein and in the claims as "near inductors") and inductors exhibiting the capacitance-increasing behavior described above with reference to $L_{far}$ (these are denominated herein and in the claims as "far inductors"). Near and far inductors can be tuned independently to provide (or at least approximate) homogenous capacitance across a range of programmable states of the qubit. In some implementations, the inductors are tuned to provide (or at least approximate) both homogenous capacitance and homogenous inductance.

Figure 2:
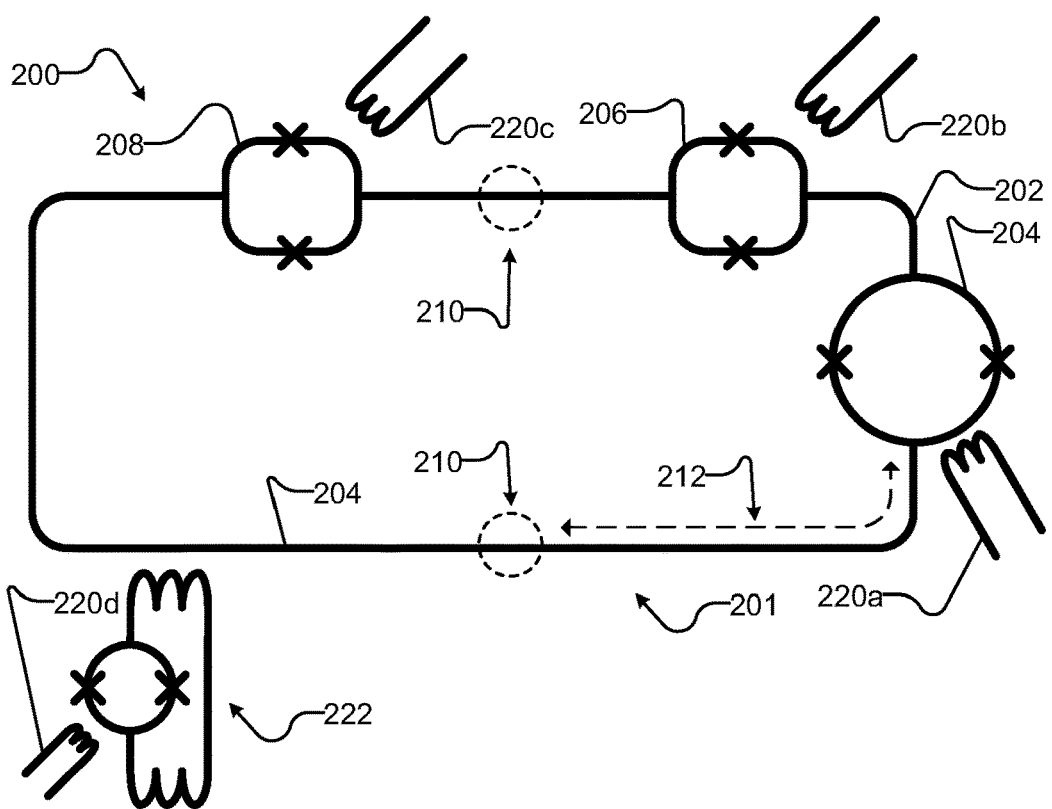
FIG. 2 is a schematic diagram of an example analog computing system comprising a qubit with inductors disposed at different distances along a qubit loop relative to one or more Josephson junctions of the qubit.

FIG. 2 shows an example analog computing system 200 comprising a qubit 201 having a qubit loop 202 and one or more Josephson junctions 204 (in the depicted exemplary implementation, one or more Josephson junctions 204 comprise a CJJ). A near inductor 206 interrupts qubit loop 202 and is tunable to provide a corresponding tunable inductance $L_{near}$. A far inductor 208 interrupts qubit loop 202 and is tunable to provide a corresponding tunable inductance $L_{far}$. (In some implementations, one, some, or all of inductors 206, 208 are inductively coupled to qubit loop 202.) In the exemplary depicted implementation of FIG. 2, analog computing system 200 further comprises a coupler 222 which is communicatively coupleable to qubit loop 202. Various devices of analog computing system 200 may be programmed via one or more programmable interfaces; in the exemplary depicted implementation, one or more Josephson junctions 204, near inductor 206, far inductor 208, and coupler 222 are programmable via programmable interfaces 220a, 220b, 220c, 220d, respectively. Although the exemplary implementation of FIG. 2 shows one near inductor 206 and one far inductor 208, it will be appreciated in view of the disclosure herein presented that pluralities of near and far inductors may be provided without straying from the scope of the present disclosure.

Figure 3:
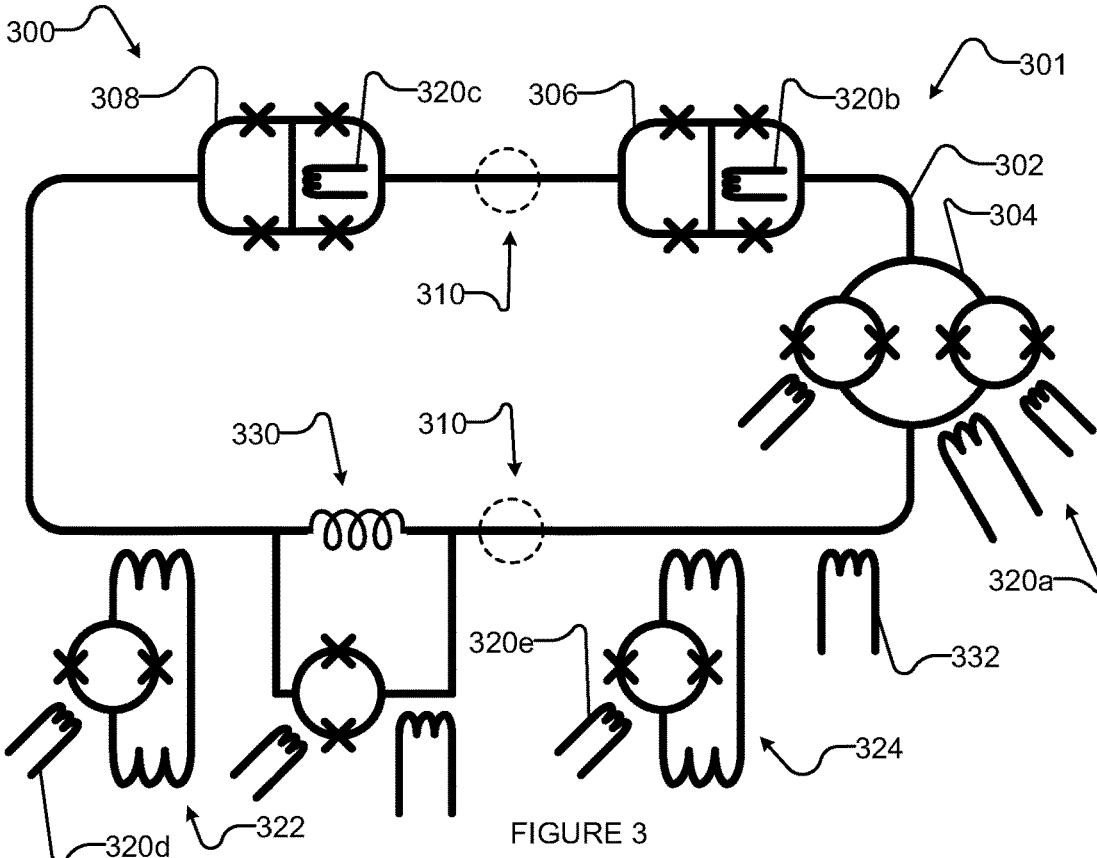
FIG. 3 is a schematic diagram of an example analog computing system comprising a qubit with serial DC-SQUID inductors disposed at different distances along a qubit loop relative to the one or more Josephson junctions of the qubit, with various further devices not shown in FIG. 2 also illustrated.

Inductors 206, 208 may comprise any tunable inductor. In some implementations, at least one of inductors 206, 208 comprises an L-tuner, e.g., as described in U.S. Pat. No. 8,536,566, and may for example comprise one or more Josephson junctions, e.g., arranged into one or more DC-SQUIDs. In the exemplary depicted implementation, each inductor 206, 208 comprises a DC-SQUID having two Josephson junctions connected in parallel and tunable via respective programming interfaces 220b, 220c. Inductors 206, 208 may alternatively or additionally comprise other sources of lumped inductance, such as a quantum flux parametron or a mutual inductance inductively coupled to the qubit loop. Inductors 206, 208 may have the same or different structure; for example, inductor 206 may comprise a single DC-SQUID and inductor 208 may comprise two DC-SQUIDs in series. (Inductor 308 of FIG. 3 is an example of the latter.)

Inductors 206, 208 are tunable (e.g., via respective programmable interfaces 220b, 220c) to provide respective inductances $L_{near}$ and $L_{far}$ within a tunable inductance range. For example, if inductor 206 is tunable to provide $L_{near}$ as low as 0 fF and as large as 10 fF, the tunable inductance range of inductor 206 is said to be 10 fF. These figures exclude any parasitic/baseline inductance, which is not tunable; for instance, continuing the previous example, if inductor 206 also provides 2 fF of parasitic inductance, and thus provides between 2 fF and 12 fF of inductance depending on its tuning, the tunable inductance range of inductor 206 is still said to be 10 fF. Inductors 206, 208 may have the same or different tunable inductance ranges.

Near inductor 206 and far inductor 208 are distinguished by their positions relative to one or more Josephson junctions 204 of qubit 201. As near inductor 206 is positioned nearer along qubit loop 202 to one or more Josephson junctions 204, near inductor 206 will tend to reduce capacitance to a greater degree (for a given increase in $L_{near}$). As far inductor 208 is positioned farther along qubit loop 202 from one or more Josephson junctions 204, far inductor 208 will tend to increase capacitance to a greater degree (for a given increase in $L_{far}$). An inductor nearer to one or more Josephson junctions than a critical distance 212 will behave generally as near inductor 206 (i.e., reducing capacitance) and an inductor farther from one or more Josephson junctions than critical distance 212 will behave generally as far inductor 208.

There can thus be inferred critical points 210 along qubit loop 202 positioned at the critical distance 212 from one or more Josephson junctions 204. Critical points 210 divide the near- and far-inductor regimes, such that inductors between one or more Josephson junctions 204 and a critical point 210 behave as near inductors and inductors between critical points 210 along a portion of qubit loop 202 which does not contain (e.g., which opposes) one or more Josephson junctions 204 behave as far inductors. Inductors nearer to the critical point will tend to have a less pronounced effect on qubit capacitance (for a given change in inductance) than inductors farther from the critical point. This scaling of capacitance-increasing or capacitance-reducing behavior is not necessarily symmetric between near and far inductors (e.g., near inductors may tend to reduce qubit capacitance by a smaller amount than far inductors even if both have the same inductance and distance from a critical point 210). Although in at least some implementations it is not necessary to expressly identify the location of critical points 210, in some implementations inductors 206, 208 (and/or other devices of system 200) are placed relative to critical points 210 to determine the relationship between their inductance and their impact on the qubit capacitance.

Inductors 206, 208 can be tuned to compensate for capacitance and/or inductance contributed to qubit 201 (so-called capacitive and/or inductive loading) by various devices. For example, coupler 222 may induce capacitive and inductive loading in qubit 201, and inductors 206, 208 can be tuned to compensate for one or both such loadings. In some implementations, inductors 206, 208 are positioned and operable to provide tunable inductance ranges such that inductors 206, 208 are capable of homogenizing qubit capacitance and/or inductance across a plurality of states of qubit 201.

For example, analog computing system 200 may be operable to put qubit 201 in a maximum-inductance state by setting all couplers 222 to ferromagnetically couple to qubit loop 202. For instance, if all couplers 222 are programmable to provide a range of coupling strengths expressed in the range [−1,1], where negative values are ferromagnetic and positive values are antiferromagnetic, the maximum-inductance state may comprise a state where all couplers 222 are programmed to provide a coupling strength of −1. Continuing the foregoing example, analog computing system 200 may be able to put qubit 201 in a minimum-inductance state by setting all couplers 222 to antiferromagnetically couple to qubit loop 202 (e.g. corresponding to a coupling strength of 1).

In some implementations, the difference between the qubit inductance at the maximum-inductance state and the qubit inductance at the minimum-inductance state is no greater than the sum of the ranges of tunable inductance of inductors 206, 208. That is, tunable inductors 206, 208 are collectively tunable to provide sufficient tunable inductance range homogenize the minimum- and maximum-inductance states' qubit inductance. For example, consider the following states for an exemplary implementation of qubit 201:

| State | Device Settings | Qubit Inductance |
|---|---|---|
| Minimum inductance | All couplers set to antiferromagnetic coupling | 100 pH |
| Maximum inductance | All couplers set to ferromagnetic coupling | 200 pH |

The difference in qubit inductance between the minimum- and maximum-inductance states is 100 pH, called the target inductance range herein. In some implementations, inductors 206, 208 provide a collective tunable inductance range of at least 100 pH. For example, inductor 206 could provide 40 pH of tunable inductance range, and inductor 208 could provide 60 pH of tunable inductance range. In some implementations, inductors 206, 208 provide a collective tunable inductance range that is greater than the target inductance range (e.g., more than 100 pH of the foregoing example), for instance to provide an allowance for variations in fabrication.

Inductors 206, 208 may also, or alternatively, be tunable to homogenize capacitance between maximum-capacitance and minimum-capacitance states of qubit 201. For example, analog computing system 200 may be operable to put qubit 201 in a maximum-capacitance state by setting all couplers 222 within critical distance 212 of one of more Josephson junctions 204 to antiferromagnetically couple to qubit loop 202 (in which case the couplers 222 within critical distance 212 reduce inductance and increase capacitance, as they are in the near-inductor region of qubit loop 202) and setting all couplers 222 farther than critical distance 212 from one or more Josephson junctions 204 to ferromagnetically couple to qubit loop 202 (in which case the couplers 222 farther than critical distance 212 increase both inductance and capacitance, as they are in the far-inductor region of qubit loop 202). For example, consider the following states for an exemplary implementation of qubit 201:

| State | Device Settings | Qubit Capacitance |
|---|---|---|
| Minimum capacitance | Couplers within the critical distance of one or more Josephson junctions 204 set to antiferromagnetic coupling | 100 fF |
| Maximum capacitance | Couplers beyond the critical distance from one or more Josephson junctions 204 set to ferromagnetic coupling | 200 fF |

In some implementations, inductors 206, 208 are tunable to homogenize the qubit capacitance of both the maximum-capacitance and minimum-capacitance states, for example by increasing or reducing the qubit capacitance to a target capacitance, as appropriate. For example, inductors 206, 208 may be tunable to increase the qubit capacitance of qubit 201 from the qubit capacitance of the minimum-capacitance state to within a threshold of a target capacitance and to decrease the qubit capacitance from the qubit capacitance of the maximum-capacitance state to within a threshold of the target capacitance. (These two thresholds may be the same as one another or different from one another.)

For instance, if the target capacitance for analog computing system 200 is 150 fF, the near inductors (e.g., inductor 206) may be tunable to reduce capacitance by at least 50 fF (to address the maximum-capacitance case) and the far inductors may be tunable to increase capacitance by at least 50 fF (to address the minimum-capacitance case).

Although the foregoing discussion refers to states induced by couplers, which are in many implementations the principal sources of varying inductive and capacitive load, minimum- and maximum-inductance and -capacitance states may be determined based on the programmable states of any devices which contribute inductive and/or capacitive load to qubit 201. Such devices include, for example, quantum flux parametrons and mutual inductances coupled to qubit 201 (e.g., a flux bias device).

In some implementations, inductors 206, 208 are tunable to homogenize both qubit inductance and qubit capacitance across each of four extreme states: minimum inductance, maximum inductance, minimum capacitance, and maximum capacitance. The relationship between inductance and capacitance is not always linear, so conforming to these constraints for both inductance and capacitance can be expected to materially affect the parameters of inductors 206, 208 in most circumstances. However, since the four extreme states define extrema in the state space of qubit 201, it is expected that in at least some implementations inductors 206, 208 which are tunable to homogenize all four extreme states across both inductance and capacitance will be tunable to homogenize all programmable states of system 200 (or, more particularly, across any programmable states of the devices varied between the four extreme states). For example, consider the following states for an exemplary implementation of qubit 201:

| State | Device Settings | Qubit Induc-tance | Qubit Capaci-tance |
|---|---|---|---|
| Minimum inductance | All devices set to decrease effective qubit inductance | 100 pH | 120 fF |
| Maximum inductance | All devices set to increase effective qubit inductance | 200 pH | 180 fF |
| Minimum capacitance | All devices within the critical distance of one or more Josephson junctions 204 set to decrease effective qubit inductance | 120 pH | 100 fF |
| Maximum capacitance | All devices within the critical distance of one or more Josephson junctions 204 set to increase effective qubit inductance | 180 pH | 200 fF |

In such implementations, near and far inductors 206, 208 must be positioned and provided with tunable inductance ranges which allow for each of the four extreme states to have (approximately, within a threshold) the same inductance and capacitance once the inductors are suitably tuned.

For example, suppose an analog computing system has a target inductance of 220 pH and a target capacitance of 160 fF. Then, for an exemplary implementation of qubit 401 with a given positioning of inductors 206, 208, inductance and capacitance might be homogenized across various programmed states of analog system 200 (sometimes referred to as "scenarios" herein) as follows:

| State | Qubit Inductance | Qubit Capacitance | $L_{near}$ | $L_{far}$ |
|---|---|---|---|---|
| Minimum inductance | 220 pH | 160 fF | 40 pH | 80 pH |
| Maximum inductance | 220 pH | 160 fF | 0 pH | 20 pH |

-continued

| State | Qubit Inductance | Qubit Capacitance | $L_{near}$ | $L_{far}$ |
|---|---|---|---|---|
| Minimum capacitance | 220 pH | 160 fF | 80 pH | 20 pH |
| Maximum capacitance | 220 pH | 160 fF | 40 pH | 0 pH |

Here, the qubit capacitance column excludes the capacitance of one of more Josephson junctions 204, $L_{near}$ is the tuned inductance of near inductor 206, and $L_{far}$ is the tuned inductance of far inductor 208. This example scenario implies that each of $L_{near}$ and $L_{far}$ require 80 pH of tunable inductance range.

In some implementations, near and far inductors 206, 208 provide a total tunable inductance range (i.e., the sum of their tunable inductance ranges) which is substantially the same as the total inductance range of a single L-tuner, e.g. as described in U.S. Pat. No. 8,536,566. For instance, if 50 pH of tunable inductance range would be required for a single L-tuner, the near and far inductors 206, 208 may collectively provide 50 pH of tunable inductance range. That tunable inductance range may be distributed between inductors 206, 208 in any appropriate way (e.g., 20 pH of tunable inductance range for inductor 206 and 30 pH of tunable inductance range for inductor 208). The choices of such distribution of tunable inductance range and the positions of inductors 206, 208 are intertwined—for instance, an inductor with a smaller tunable inductance range may need to be positioned farther from critical point 210 to provide adequate capacitance reduction/increase.

A variety of arrangements of inductors 206, 208 may satisfy such conditions. Different arrangements may be compared (e.g., by simulation), and the selection of a particular arrangement may be affected by factors such as locations available on the processor for device placement, proximity to other devices, fabrication tolerances, and/or other factors. Simulations may be assisted by adding a constraint that, for each scenario, there is some fixed total inductance value $L_{total}$ such that $L_{total}=L_{near}+L_{far}$. ($L_{total}$ may vary between scenarios.) $L_{total}$ may be determined based on a single L-tuner implementation, as described above; the scope of the simulation may thus be reduced to exploring different combinations of tunable inductance range distribution between inductors 206, 208 and placements of inductors 206, 208.

In some implementations, system 200 comprises more than one near inductor 206 and/or more than one far inductor 208 (e.g., by providing secondary near and/or far inductors). The collective near inductors 206 may then collectively provide a tunable inductance $L_{near}$ and a corresponding tunable inductance range; the various placements of the near inductors 206 will then determine the collective effect of near inductors 206 on qubit capacitance. Similarly, the collective far inductors 208 may then collectively provide a tunable inductance $L_{far}$ and a corresponding tunable inductance range; the various placements of the far inductors 208 will then determine the collective effect of far inductors 208 on qubit capacitance.

FIG. 2 is simplified for convenience of illustration.

FIG. 3 shows a more complex example analog computing system 300 comprising a qubit 301 having a qubit loop 302 and one or more Josephson junctions 304. In the depicted exemplary implementation, one or more Josephson junctions 304 comprise a compound-compound Josephson junction, or CCJJ, which comprises two compound Josephson junctions. Near inductor 306 and far inductor 308 each comprise two DC-SQUIDs connected in series and provide tunable inductances $L_{near}$ and $L_{far}$, respectively. In at least some implementations, the compound features of one or more Josephson junctions 304 and inductors 306, 308 can allow for more precise tuning within a programmable range relative to the simpler devices of FIG. 2.

System 300 also provides a plurality of couplers coupleable to qubit 301, including far coupler 322 and near coupler 324. Far coupler 322 is disposed more than the critical distance from one or more Josephson junctions 304 along qubit loop 302 (i.e., on the far side of critical point 310), and near coupler 324 is disposed less than the critical distance from one or more Josephson junctions 304 (i.e., on the near side of critical point 310). Couplers 322, 324 will thus tend to have different effects on qubit capacitance as their inductive load on qubit 301 changes.

In implementations where inductors 306, 308 are positioned and of suitable scale to compensate for such inductive and/or capacitive load, the position and/or scale of one or both of inductors 306, 308 may be affected by the arrangement of couplers 322, 324. For example, in some implementations inductors 306, 308 may be positioned and/or scaled to compensate for capacitance in a maximum-capacitance scenario where near coupler 324 is antiferromagnetically coupled to qubit 301 and far coupler 322 is ferromagnetically coupled to qubit 301 (e.g., as described above), and vice-versa for the minimum-capacitance scenario.

One or more Josephson junctions 304, inductors 306, 308, and couplers 322, 324 are programmable via programmable interfaces 320a, 320b, 320c, 320d, 320e, respectively. System 300 further provides exemplary other devices such as a quantum flux parametron 330 interrupting qubit loop 302 and a programmable flux bias 332 coupleable to qubit 301. Such other devices may be used to interact with qubit 301 (e.g., to read out its state and/or to program it with the relevant parameters of a problem Hamiltonian) and may contribute to inductive and/or capacitive loading of qubit 301. In some implementations, inductors 306, 308 are positioned and/or scaled to compensate for inductive and/or capacitive loading contributed by such other devices (e.g., so as to compensate for the load contributed by operating such other devices to increase or decrease inductive or capacitive load, as appropriate, in the various scenarios described elsewhere herein).

Figure 4A:
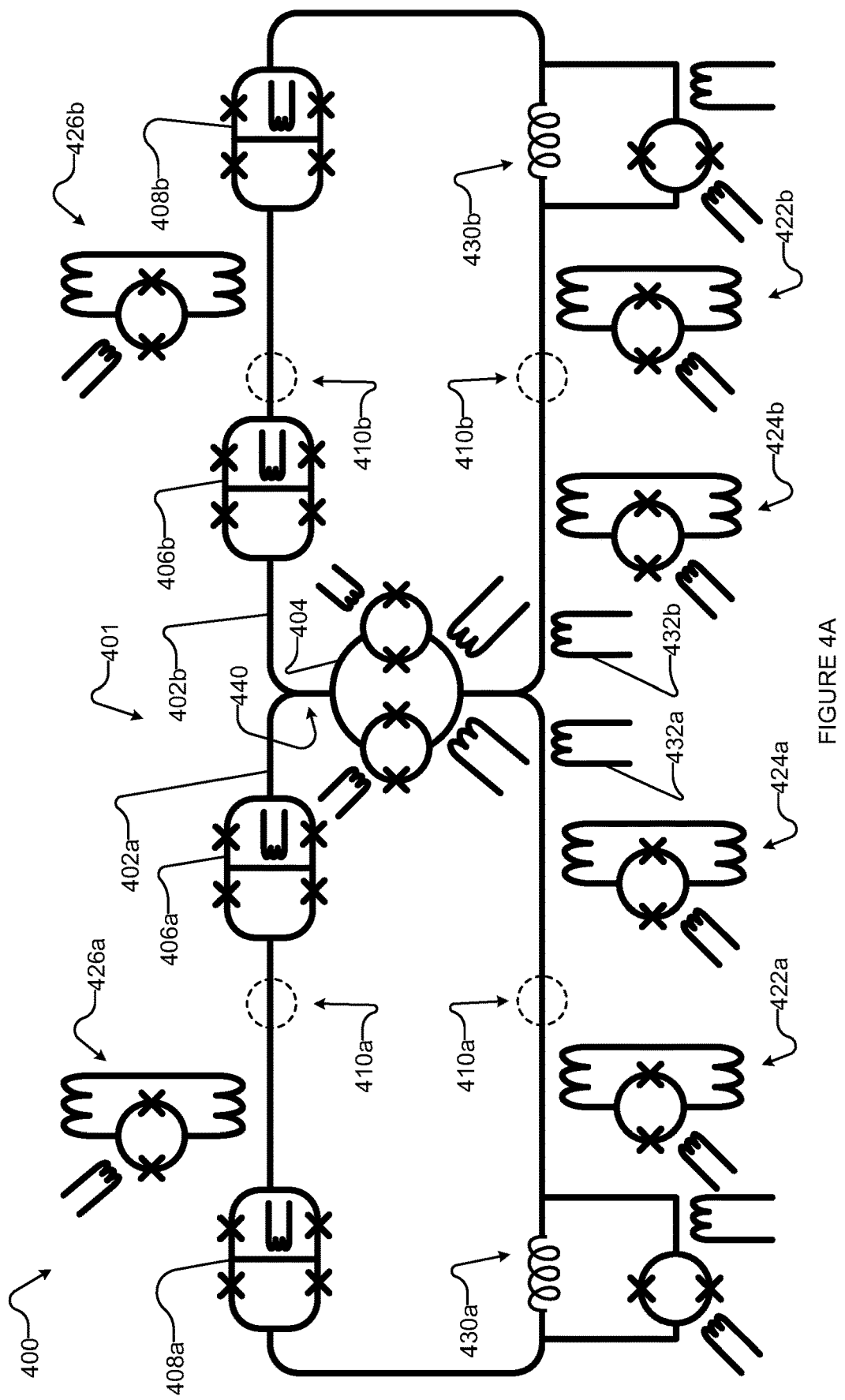
FIG. 4A is a schematic diagram of an example analog computing system comprising a qubit having two qubit loops, each loop substantially similar to the qubit loop of the exemplary qubit of FIG. 3.

The systems disclosed herein are not limited to single-qubit-loop implementations. FIG. 4A shows an example analog computing system 400 comprising a qubit 401 having a plurality of qubit loops 402a, 402b interrupted by one or more Josephson junctions 404 shared between qubit loops 402a, 402b. (Qubit loops 402a, 402b may partially overlap along a shared portion 440, e.g., as shown in FIG. 4A.) In at least the depicted exemplary implementation, each qubit loop 402a, 402b is coupleable to and/or comprises devices substantially similar to those of systems 200, 300.

For example, in the depicted embodiment qubit loop 402a is interrupted by near inductor 406a and far inductor 408a (disposed on opposing sides of critical point 410a) and is communicatively coupleable to a plurality of couplers 422a, 424a, 426a. Qubit loop 402a may further be coupleable to and/or comprises other devices, such as quantum flux parametron 430a and/or flux bias 432a. Qubit loop 402b may be coupleable to and/or comprise similar or different devices; in the depicted exemplary implementation, qubit loop 402b is substantially similar to qubit loop 402a and is interrupted by near inductor 406b and far inductor 408b (disposed on opposing sides of critical point 410b) and is coupleable to a plurality of couplers 422b, 424b, 426b. Qubit loop 402b may further be coupleable to and/or comprises other devices, such as quantum flux parametron 430b and/or flux bias 432b.

In some implementations, qubit loops 402a, 402b have critical points 410a, 410b which are disposed at different critical distances from one or more Josephson junctions 404—e.g., where qubit loops 402a, 402b are not identical (e.g., where they are composed of different materials, have asymmetric layout, and/or are coupleable asymmetrically to other devices of system 400a). Critical point 410b may thus be said to be disposed by a second critical distance from the one or more Josephson junctions along qubit loop 402b, which may be the same as or different than the critical distance of critical points 410a.

Figure 4B:
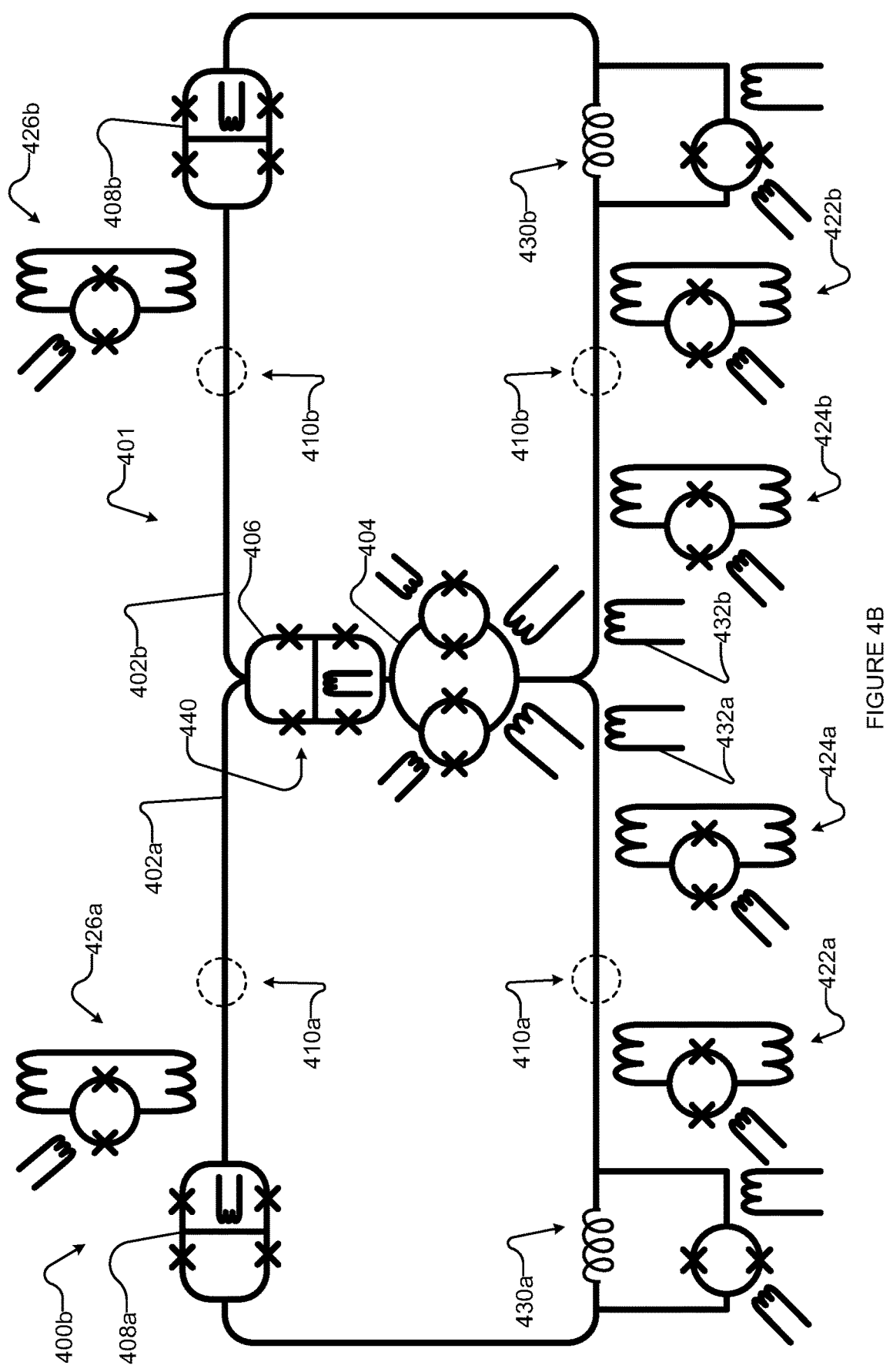
FIG. 4B is a schematic diagram of an example analog computing system similar to that of FIG. 4A, except that two near inductors are replaced by one shared inductor.

In some implementations, each qubit loop 402a, 402b comprises at least one near inductor 406a and at least one far inductor 408a, thereby allowing for inductive and/or capacitive load on each loop to be compensated for independently. In some implementations, qubit loops 402a, 402b share at least one near inductor 406a and/or far inductor 408a. For example, as depicted in exemplary system 400b of FIG. 4B, a shared near inductor 406 may be positioned along shared portion 440. In some implementations, shared near inductor 406 provides greater tunable inductance range than either near inductor 406a, 406b of otherwise-similar system 400 in order to compensate for inductance across both qubit loops 402a, 402b. A potential advantage of such an arrangement is space-saving; in addition to reducing the minimum number of inductors required (from one on each wing to one per qubit), shared inductor 406 can itself be physically smaller (e.g., by providing a DC-SQUID with smaller Josephson junctions, as smaller Josephson junctions generally provide greater inductance than larger ones). This difference in size is not depicted to maintain legibility of FIG. 4B.

In some implementations the collective tunable range of near and far inductors 406a, 406b, 408a, 408b of a qubit 401 with multiple loops 402a, 402b is larger than the amount indicated by the difference in inductance between the maximum-inductance and minimum-inductance states by a tolerance amount (e.g., 20 pH). This tolerance amount may be sufficiently large to allow the near and far inductors 406a, 406b, 408a, 408b to be tuned to compensate for variations between wings arising from fabrication defects, design variances, and/or other asymmetries. This tolerance value may be further increased to account for variances between qubits, e.g. as described elsewhere herein.

Tuning Split L-Tuners

Figure 5:
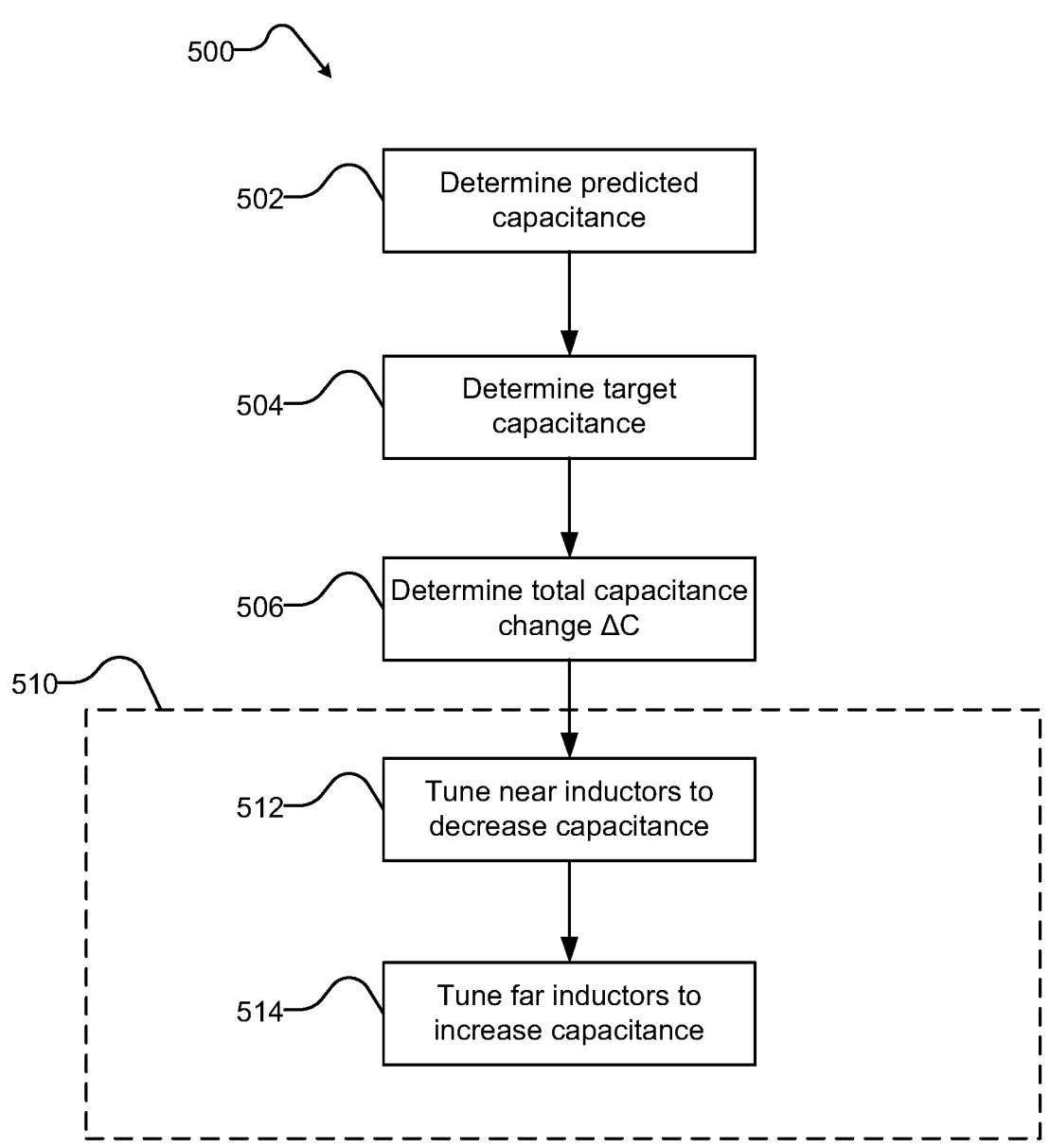
FIG. 5 is a flowchart of a method for tuning an effective capacitance of an example qubit in an analog computing system, such as the analog computing system of FIG. 2.

FIG. 5 is a flowchart of a method 500 for tuning an effective capacitance of a qubit in an analog computing system, such as qubit 201, 301, or 401 of system 200, 300, or 400, respectively. The method is performed by one or more processors (e.g., classical processors) in communication with the analog computing system.

At 502, the one or more processors determine a predicted capacitance for the qubit, denoted $C_{predicted}$, based on a problem to be executed by the analog computing system. For example, if a given problem is transformed into a Hamiltonian for encoding onto the analog computing system (a process sometimes called "embedding"), the one or more processors may determine $C_{predicted}$ for the qubit by applying the portions of the Hamiltonian relating to that qubit (e.g., the parameters corresponding to coupling strengths for couplers coupleable to the qubit) to a physical model of the qubit. For instance, the one or more processors may determine, for each coupler, an associated inductive load for the qubit based on a respective coupling strength of each coupler, and may further determine an associated capacitive load for the qubit based on a respective inductive load of each coupler and a respective distance of each coupler from the one or more Josephson junctions of the qubit along the qubit loop, e.g., based on the models for $C_{eff}$ described above. The one or more processors may combine these capacitive loads (e.g., by summing the capacitive loads, and/or by a weighted or non-linear combination) and, based on the combined capacitive loads and any other suitable factors (such as capacitive loads of other devices, a baseline capacitance of the qubit, and the programmed state of the one or more Josephson junctions) determine a predicted capacitance $C_{predicted}$ of the qubit.

At 504, the one or more processors determine a target capacitance for the qubit, denoted $C_{target}$. Method 500 aims to tune the effective capacitance of the qubit to be within a threshold of target capacitance $C_{target}$. Target capacitance $C_{target}$ may be predetermined (e.g., the target capacitance $C_{target}$ may be a fixed value for the qubit determined at design-time), in which case the determination by the processor may comprise retrieving a value of the target capacitance $C_{target}$ from a data store. A predetermined target capacitance $C_{target}$ may be determined, for example, by experimental methods, such as by using magnetic resonance tunneling, qubit spectroscopy, and/or other techniques to identify qubit capacitance. For instance, in a quantum-annealing system, this may involve observing the behavior of a qubit (and/or a larger system, such as system 200, 300, 400) at the quantum critical point—that is, at the energy scale where disordering and problem Hamiltonians have equal energy—to ensure it exceeds some baseline noise threshold given a certain capacitance.

In some implementations, target capacitance $C_{target}$ is determined dynamically by the processor, e.g., after receiving a given problem for execution by the quantum processor. For instance, target capacitance may be determined by determining predicted capacitances $C_{predicted}$ for each of a plurality of qubits of the analog computing system for a given problem and determining a target capacitance $C_{target}$ based on those predicated capacitances $C_{predicted}$, such as by taking an average of the target capacitances, and/or by determining a value for $C_{target}$ which minimizes an objective function (e.g., a sum of L1 or L2 norms between each qubit's $C_{predicted}$ and $C_{target}$). Such determination may be subject to one or more constraints; for example, the choice of $C_{target}$ may be constrained so that the analog computing system is operable to increase or decrease (as appropriate) the effective capacitance $C_{eff}$ of each qubit of the plurality from each qubit's predicted capacitance $C_{predicted}$ to within a threshold of the target capacitance $C_{target}$.

At 506, the one or more processors determine a total capacitance change for the qubit, denoted $\Delta C$, based on the predicted capacitance $C_{predicted}$ and target capacitance $C_{target}$. In at least some implementations, the total capacitance change $\Delta C$ is the difference between $C_{target}$ and $C_{predicted}$.

At 510, the one or more processors tune a plurality of inductors of the analog computing system to change the effective capacitance of the qubit based on the distance of each inductor from the one or more Josephson junctions of the qubit along the qubit loop and based on the total capacitance change $\Delta C$. For instance, the one or more processors may tune the plurality of inductors to increase or decrease (as appropriate) the effective capacitance of the qubit, $C_{eff}$, by an amount which is within a threshold of $\Delta C$. Such tuning may comprise, for example, transmitting a representation of the problem to the analog computing system for execution (and thus causing the analog computing system to execute the representation of the problem) which includes parameters which cause the analog computing system to program the plurality of inductors to provide the tunable inductances determined in the course of performing method 500. In some implementations, the one or more processors tune the inductors to compensate for a coupler-induced capacitive load (e.g., predicted as described above with reference to act 502).

In at least some implementations, the tuning of act 510 comprises tuning a near inductor which is nearer to the one or more Josephson junctions than the critical distance along the qubit loop to decrease the qubit capacitance (at act 512) and tuning a far inductor which is farther from the one or more Josephson junctions than the critical distance along the qubit loop to increase the qubit capacitance (at act 514).

The near and far inductors may be tuned based on their respective distances from the one or more Josephson junctions—for example, by tuning the near and far inductors based on their distances from a critical point (such as the nearest critical point). As noted elsewhere herein, the capacitive load of an inductor per unit of inductance generally varies with the position of the inductor along the qubit loop. Thus, determining the inductance required to achieve a particular change in the effective qubit capacitance $C_{eff}$ may comprise, for example, looking up a value from a datastore (such as a lookup table) which stores values of capacitive change for corresponding changes in inductance for inductors of a certain distance from the one or more Josephson junctions (such values may be predetermined, e.g., experimentally), applying a model of qubit capacitance to an inductor based on the distance of the inductor from the one or more Josephson junctions (e.g., by using a model which explicitly includes such distance as a parameter, and/or by selecting a model based on that distance, such as one of the models for $C_{eff}$ given above), and/or other approaches.

The tuning of act 510 may be as simple as tuning one of the near or far inductors to achieve (or at least approximate) the desired total capacitance change $\Delta C$, for example by increasing the inductance of a far inductor to increase capacitance by $\Delta C$ (or at least to within a threshold of $\Delta C$) or by increasing the inductance of a near inductor to decrease capacitance by $\Delta C$. However, in at least some circumstances, such tuning can cause the effective inductance of the qubit to become less homogeneous across different programmed states of the qubit.

Such inhomogeneity can be undesirable in at least some applications. In at least some implementations, method 500 further comprises determining predicted and target inductances for the qubit, determining a total inductance change $\Delta L$ based on the predicted and target inductances, and tuning the plurality of inductors to increase the collective inductance of the inductors (that is, the sum of their inductances) by an amount which is within a threshold of $\Delta L$.

Note that the change in qubit inductance is not necessarily the same as the value of $\Delta L$, since the inductance contributed by an inductor to effective qubit capacitance may be less than the inductance contributed locally by the inductor. For example, the case of qubit 401 of FIG. 4A the effective qubit inductance can in some situations increase by roughly a quarter-unit for every unit of tunable inductance contributed by an inductor 406a, 406b, 408a, 408b (e.g., where the inductances of qubit loops 402a, 402b are roughly equal) due to the parallel arrangement of qubit loops 402a, 402b. Accordingly, in some embodiments, determining the total inductance change $\Delta L$ comprises determining a total inductance change for the inductors to achieve (or at least approximate) a total inductance change for the qubit, where the total inductance change is determinable (e.g., based on a difference between the target and predicted inductances).

In at least some implementations, the total inductance change is distributed between inductors based not only on $\Delta L$ but also based on $\Delta C$. For example, method 500 may homogenize (to within a threshold) both $\Delta L$ and $\Delta C$ across various programmed states of the analog computing system (such as the states described elsewhere herein). A given total inductance change $\Delta L$ can be distributed between inductors in various ways, but in most circumstances most such distributions will not achieve (or at least approximate) a specific desired change in qubit capacitance.

Figure 6:
FIG. 6 is a flowchart of a method for distributing inductance between near and far inductors, e.g., as part of the method of FIG. 5.
Figure 6:
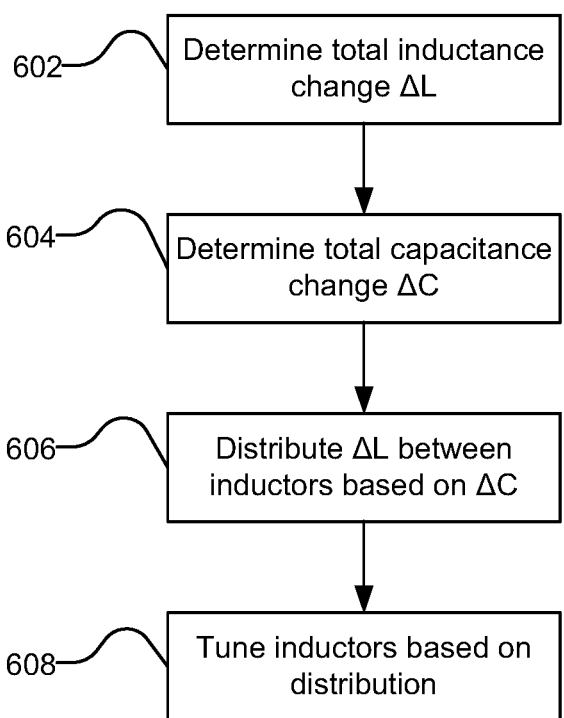

FIG. 6 is a flowchart of a method 600 for distributing inductance between near and far inductors. The method is performed by one or more processors (e.g., classical processors) in communication with the analog computing system and may be performed as part of method 500. At 602, the one or more processors determine a total inductance change $\Delta L$ (e.g., based on target and predicted inductances, as described above) and at 604, the one or more processors determine a total capacitance change $\Delta C$ (e.g., based on target and predicted capacitances, as described above with reference to act 506 of method 500).

At 606, the one or more processors determine a distribution of the total inductance change $\Delta L$ between the inductors of the analog computing system so that the corresponding tunable inductances of the inductors are collectively within a threshold of the total inductance change $\Delta L$ (e.g., so that the sum of those tunable inductances sum to within a threshold of the total inductance change $\Delta L$) based on the total capacitance change $\Delta C$. In some implementations, act 606 comprises identifying a plurality of candidate distributions of inductor tuning values. Each candidate distribution comprises values of tunable inductance for each of the inductors and thus corresponds to a capacitance change arising from (and/or predicted to arise from) tuning the inductors to provide those values of tunable inductance. A distribution may then be selected from the plurality of candidates, e.g., by selecting the candidate with a (predicted) capacitance change which is nearest the total capacitance change $\Delta C$.

The plurality of candidate distributions may be determined by, for example, looking up a value in a lookup table which associates values of $\Delta L$ to values of $\Delta C$. In some implementations, the lookup table has $\Delta L$ and $\Delta C$ values as axes and each ($\Delta L$, $\Delta C$) coordinate in the table maps to a candidate distribution which provides (or is predicted to provide) the corresponding $\Delta L$ and $\Delta C$ values being looked up (at least to within a threshold). For example, in an exemplary two-inductor system 200 such as that illustrated in FIG. 2, if a total inductance change $\Delta L$=100.1 pH was determined at act 602 and a total capacitance change $\Delta C$=59.9 fF was determined at act 604, act 606 may comprise looking up the coordinate (100 pH, 60 fF) in the lookup table and identifying a candidate distribution $L_{near}$=80 pH, $L_{far}$=20 pH. (The foregoing example assumes that a coordinate that more precisely approximates the lookup value is not represented by the table.)

In some implementations, the lookup table has values of tunable inductance as axes (e.g., $L_{near}$ and $L_{far}$) and maps each coordinate (e.g. ($L_{near}$, $L_{far}$) coordinate) to a candidate $\Delta C$ value. (In some implementations, $\Delta L$ is also mapped to by the table; in other implementations, $\Delta L$ is omitted by the table, in which case $\Delta L$ may be inferred by combining the coordinate values, e.g., by calculating $\Delta L=-L_{near}+_{far}$). A plurality of candidate distributions may be identified in the table, e.g., by identifying all coordinates which correspond (at least within a threshold) to the total inductance change $\Delta L$. For instance, in an exemplary two-axis table having $L_{near}$ and $L_{far}$ as axes, a diagonal may be identified (e.g., defined by, for each value of $L_{near}$, the ($L_{near}$, $L_{far}$) coordinate where $L_{near}=\Delta L-L_{far}$, if such a value exists, at least approximately) and the value along that diagonal with a corresponding candidate $\Delta C$ value which is closest to the total conductance change $\Delta C$ may be selected. Such lookup tables may comprise more than two dimensions (e.g., to explicitly represent more than two inductors along its axes). However, even where more than two tunable inductors are provided, the lookup table may provide fewer axes; for instance, the lookup table may provide $L_{near}$ and $L_{far}$ as axes, allowing the one or more processors to distribute inductance between the near and far inductors. Sub-distributions among the near inductors (based on $L_{near}$) and the far inductors (based on $L_{far}$) may subsequently be determined by reference to other lookup tables, by applying models, or via other suitable approaches.

In some implementations, act 606 comprises interpolating inductor tuning values for the inductors of the analog computing system. For example, the inductor tuning values for a coordinate (e.g., ($\Delta L$, $\Delta C$), ($L_{near}$, $L_{far}$), and/or some other coordinate) may be interpolated based on the selected distribution and based on an additional candidate distribution, such as a candidate distribution which is proximate (e.g., adjacent) to the selected distribution in the lookup table. As used herein, "proximate" refers to a distribution that is within a small threshold (e.g., one integer value, $\pm 1\%$ of each coordinate value) of variation around the selected distribution. This threshold will define an area around the coordinates of the selected distribution that is considered to be "proximate". For instance, returning to the foregoing example where a total inductance change $\Delta L$=100.1 pH was determined at act 602 and a total capacitance change $\Delta C$=59.9 fF was determined at act 604, act 606 may comprise selecting the candidate distribution at the distribution (100 pH, 60 fF), e.g., as described above, and interpolating a value for the coordinate (100.1 pH, 59.9 fF) by interpolating the inductor tuning values for (100 pH, 60 fF) with the inductor tuning values for an additional candidate distribution having coordinates (101 pH, 59 fF). The interpolation may comprise taking a weighted average of the selected distribution and that other candidate distribution, e.g., weighted based on each distribution's distance (e.g., Cartesian distance) from the coordinate (100.1 pH, 59.9 fF), where nearer distributions receive greater weight. In this example, the "proximate" distribution is one integer value larger in each coordinate than the selected distribution.

At 606, the one or more processors tune the inductors based on the selected distribution, e.g., by programming each inductor to provide (or at least approximate) the tunable inductance provided for it in the selected distribution. Act 606 may be performed as part of act 510 of method 500.

Computing Systems

Figure 7:
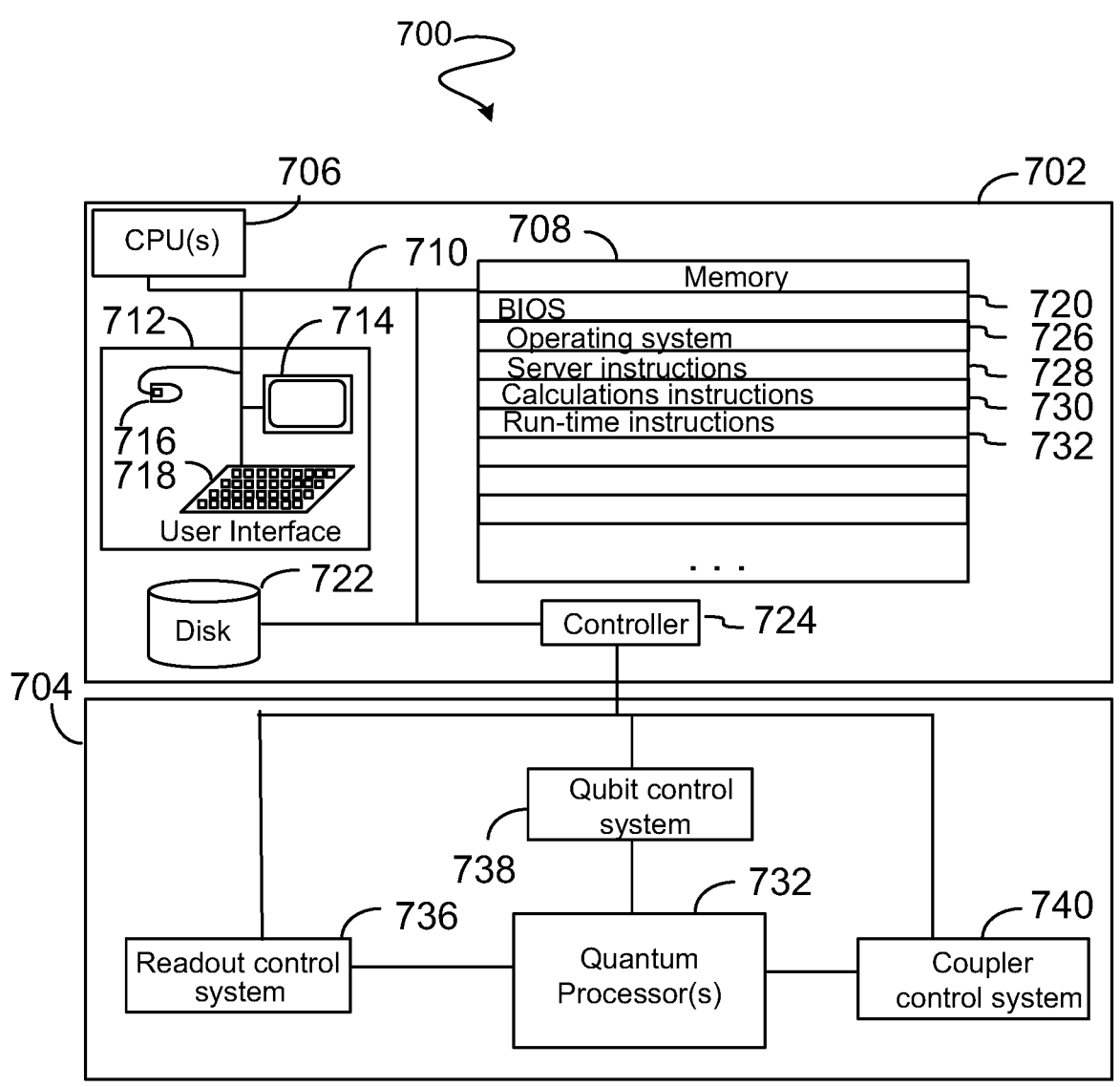
FIG. 7 is a schematic diagram showing an example hybrid computing system in which the technologies described herein may be implemented.

The foregoing methods may be performed by a hybrid computing system (e.g. comprising the foregoing analog computing systems). FIG. 7 illustrates an example hybrid computing system 700 including a digital computer 702 coupled to an analog computer 704. In some implementations, analog computer 704 is a quantum computer and digital computer 702 is a classical computer.

The exemplary digital computer 702 includes a digital processor (such as one or more central processor units 706) that may be used to perform classical digital processing tasks described in the present systems and methods. Those skilled in the relevant art will appreciate that the present systems and methods can be practiced with other digital computer configurations, including hand-held devices, multiprocessor systems, microprocessor-based or programmable consumer electronics, personal computers ("PCs"), network PCs, mini-computers, mainframe computers, and the like, when properly configured or programmed to form special purpose machines, and/or when communicatively coupled to control an analog computer, for instance a quantum computer.

Digital computer 702 will at times be referred to in the singular herein, but this is not intended to limit the application to a single digital computer. The present systems and methods can also be practiced in distributed computing environments, where tasks or sets of instructions are performed or executed by remote processing devices, which are linked through a communications network. In a distributed computing environment computer-readable and/or processor-readable instructions (sometimes known as program modules), application programs and/or data, may be stored in local and/or remote memory storage devices (e.g., non-transitory computer-readable and/or processor-readable media).

Digital computer 702 may include at least one or more digital processors (e.g., one or more central processor units 706), one or more system memories 708, and one or more system buses 710 that couple various system components, including system memory 708 to central processor unit 706.

The digital processor may be any logic processing unit, such as one or more central processing units ("CPUs") with one or more cores, graphics processing units ("GPUs"), digital signal processors ("DSPs"), application-specific integrated circuits ("ASICs"), field-programmable gate arrays ("FPGAs"), programmable logic controllers (PLCs), etc.

Digital computer 702 may include a user input/output subsystem 712. In some implementations, the user input/output subsystem includes one or more user input/output components such as a display 714, mouse 716, and/or keyboard 718. System bus 710 can employ any known bus structures or architectures, including a memory bus with a memory controller, a peripheral bus, and a local bus. System memory 708 may include non-volatile memory, for example one or more of read-only memory ("ROM"), static random-access memory ("SRAM"), Flash NAND; and volatile memory, for example random access memory ("RAM") (not shown), all of which are examples of non-transitory computer-readable and/or processor-readable media.

A basic input/output system ("BIOS") 720, which can form part of the ROM, contains basic routines that help transfer information between elements within digital computer 702, such as during startup.

Digital computer 702 may also include other non-volatile memory 722. Non-volatile memory 722 may take a variety of forms, including: a hard disk drive for reading from and writing to a hard disk, an optical disk drive for reading from and writing to removable optical disks, and/or a magnetic disk drive for reading from and writing to magnetic disks, all of which are examples of non-transitory computer- or processor-readable media. The optical disk can be a CD-ROM or DVD, while the magnetic disk can be a magnetic floppy disk or diskette. Non-volatile memory 722 may communicate with digital processor via system bus 710 and may include appropriate interfaces or controllers 724 coupled to system bus 710. Non-volatile memory 722 may serve as non-transitory long-term storage for computer-readable and/or processor-readable instructions, data structures, or other data (also called program modules) for digital computer 702.

Although digital computer 702 has been described as employing hard disks, optical disks and/or magnetic disks, those skilled in the relevant art will appreciate that other types of non-volatile computer-readable media may be employed, such magnetic cassettes, flash memory cards, Flash, ROMs, smart cards, etc., all of which are further examples of non-transitory computer- or processor-readable media. Those skilled in the relevant art will appreciate that some computer architectures conflate volatile memory and non-volatile memory. For example, data in volatile memory can be cached to non-volatile memory, or a solid-state disk that employs integrated circuits to provide non-volatile memory. Some computers place data traditionally stored on disk in memory. As well, some media that are traditionally regarded as volatile can have a non-volatile form, e.g., Non-Volatile Dual In-line Memory Module variation of Dual In-Line Memory Modules.

Various sets of computer-readable and/or processor-readable instructions (also called program modules), application programs and/or data can be stored in system memory 708. For example, system memory 708 may store an operating system 726, server instructions 728, calculations instructions 730, and/or run-time instructions 732.

While shown in FIG. 7 as being stored in system memory 708, the program modules and other data can be stored elsewhere including in non-volatile memory 722 or in one or more other non-transitory computer-readable and/or processor-readable media.

Analog computer 704 can be provided in an isolated environment (not shown). For example, where analog computer 704 is a quantum computer, the environment shields the internal elements of the quantum computer from heat, magnetic field, and the like. Analog computer 704 includes one or more analog processors such as quantum processor(s) 734.

A quantum processor includes programmable elements such as qubits, couplers, and other devices. In one implementation, the qubits are superconducting flux qubits. The qubits are read out via readout system 736. These results can be fed to the various sets of computer-readable and/or processor-readable instructions for digital computer 702. Analog computer 704 can include a qubit control system 738 and a coupler control system 740. Coupler control system 740 can provide control of communicative coupling between qubits such as inductive and capacitive communicative coupling described in the present application.

In some embodiments, hybrid computer 700 is used to implement quantum annealing on quantum processor 734.

In some implementations, digital computer 702 can operate in a networked environment using logical connections to at least one client computer system. In some implementations, digital computer 702 is coupled via logical connections to at least one database system. These logical connections may be formed using any means of digital communication, for example, through a network, such as a local area network ("LAN") or a wide area network ("WAN") including, for example, the Internet. The networked environment may include wired or wireless enterprise-wide computer networks, intranets, extranets, and/or the Internet. Other embodiments may include other types of communication networks such as telecommunications networks, cellular networks, paging networks, and other mobile networks. The information sent or received via the logical connections may or may not be encrypted. When used in a LAN networking environment, digital computer 702 may be connected to the LAN through an adapter or network interface card ("NIC") (communicatively linked to system bus 710). When used in a WAN networked environment, digital computer 702 may include an interface and modem (not shown), or a device such as NIC, for establishing communications over the WAN. Non-networked communications may additionally, or alternatively, be employed.

In accordance with some embodiments of the present systems and devices, a quantum processor (such as quantum processor 734 of FIG. 7) may be designed to perform quantum annealing and/or adiabatic quantum computation. An evolution Hamiltonian is constructed, that is proportional to the sum of a first term proportional to a problem Hamiltonian and a second term proportional to a delocalization Hamiltonian, as follows:

$$H_E \propto A(t)H_P + B(t)H_D$$

where $H_E$ is the evolution Hamiltonian, $H_P$ is the problem Hamiltonian, $H_D$ is the delocalization Hamiltonian, and A(t), B(t) are coefficients that can control the rate of evolution, and typically lie in the range [0,1].

In some implementations, a time-varying envelope function is placed on the problem Hamiltonian. A suitable delocalization Hamiltonian is given by:

$$H_D \propto -\frac{1}{2}\sum_{i=1}^{N}\Delta_i\sigma_i^x$$

where N represents the number of qubits, $$H_D \propto -\frac{1}{2}\sum_{i=1}^{N}\Delta_i\sigma_i^x$$

is the Pauli x-matrix for the $i^{th}$ qubit and $\Delta_i$ is the single qubit tunnel splitting induced in the $i^{th}$ qubit. Here, the $$\sigma_i^x$$

terms are examples of "off-diagonal" terms.

A common problem Hamiltonian includes a first component proportional to diagonal single qubit terms, and a second component proportional to diagonal multi-qubit terms, and may be of the following form:

$$H_P \propto -\frac{\varepsilon}{2}\left[\sum_{i=1}^{N}h_i\sigma_i^z + \sum_{j>i}^{N}J_{ij}\sigma_i^z\sigma_j^z\right]$$

where N represents the number of qubits, $$\sigma_i^z$$

is the Pauli z-matrix for the $i^{th}$ qubit, $h_i$ and $J_{ij}$ are dimensionless local fields for the qubits, and couplings between qubits, respectively, and $\varepsilon$ is a characteristic energy scale for $H_P$. The $$\sigma_i^z \text{ and } \sigma_i^z\sigma_j^z$$

terms are examples of "diagonal" terms. The former is a single-qubit term and the latter a two-qubit term.

Homogenizing inductance and/or capacitance across programmable states of an individual qubit, and/or across qubits across a quantum processor, can assist in homogenizing their physical behaviour. Such homogenization of the underlying physics can, in suitable circumstances, enable the quantum processor to more accurately instantiate the foregoing computational models, thereby improving the performance of the quantum processor and consequently of hybrid computing system 700 more generally.

Butterfly Qubits

As discussed above, superconducting flux qubits (for example superconducting flux qubit 100*a*) may include a loop of superconducting material (e.g., qubit loop 102) interrupted by a Josephson junction (e.g., CJJ 104). Qubits are connected by couplers (e.g., coupler 222) within a quantum processor, and the type and complexity of problems that may be solved by the processor may be impacted by the connectivity between qubits. In some implementations, increasing connectivity between single loop flux qubits (e.g., flux qubit 100*a*, 201) is realized at least in part by increasing the length of the qubit to accommodate the additional couplers. Increased qubit length may result in increased inductance and capacitance and a corresponding reduction in energy scale. In some implementations, it may be beneficial to provide a multi-loop flux qubit (e.g., qubit 401) as discussed above with respect to FIGS. 4A and 4B and in further detail below. Multi-loop flux qubits may allow for increased connectivity without a corresponding decrease in energy scale.

Figure 8:
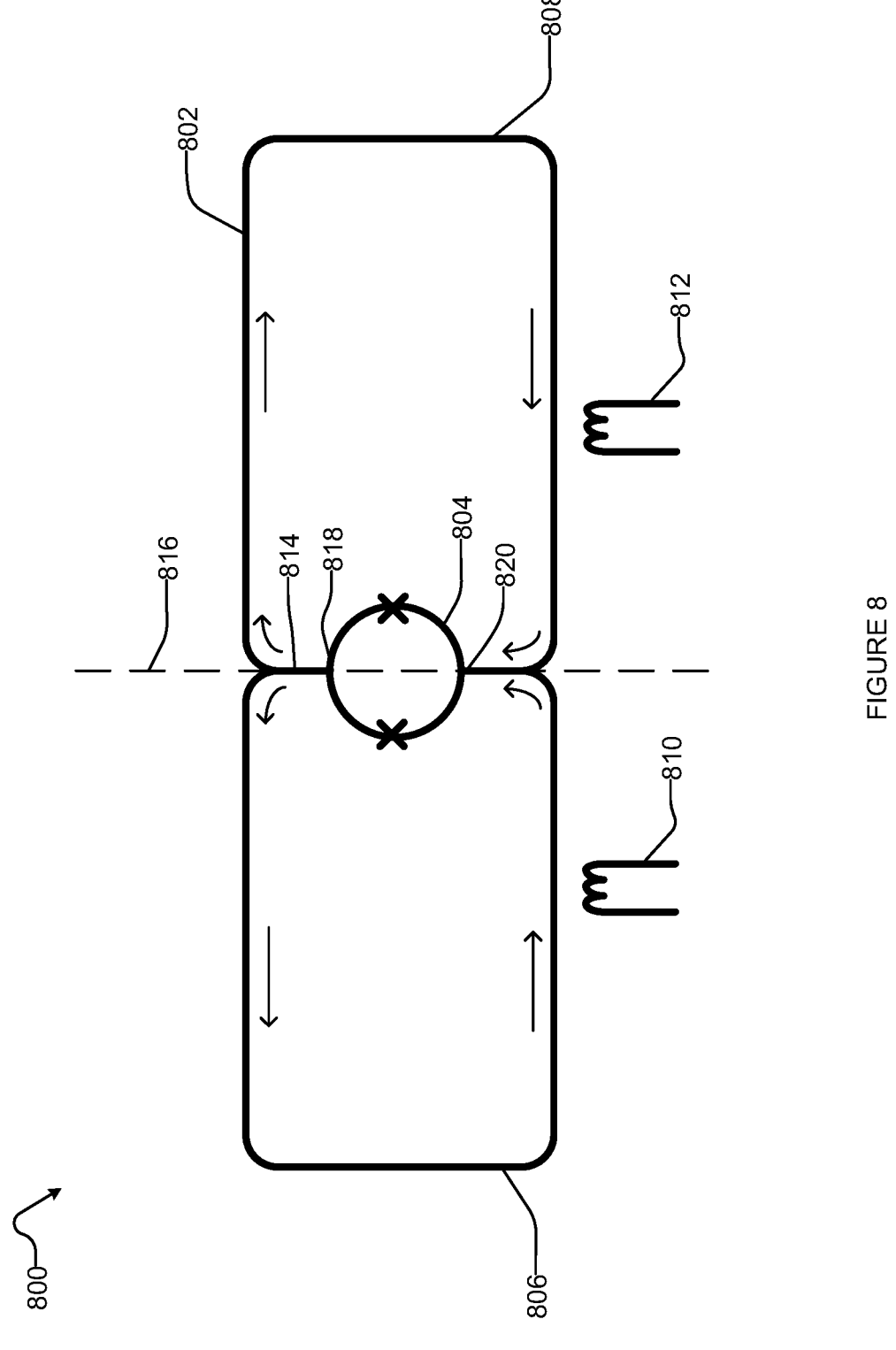
FIG. 8 is a schematic diagram of an example qubit having two loops.

In the example implementation of FIG. 8, an analog computing system 800 has a qubit 802 with a Josephson junction 804, a first qubit loop 806 formed by a first superconducting current path, and a second qubit loop 808 formed by a second superconducting current path. First qubit loop 806 and second qubit loop 808 are electrically connected in parallel across Josephson junction 804. A qubit with two loops may also be referred to as a two wing qubit or butterfly qubit, each of the loops constituting one of the wings. In the example implementation of FIG. 8, first qubit loop 806 and second qubit loop 808 are symmetric about axis 816 of Josephson junction 804, axis 816 intersecting first connection 818 between first and second qubit loops 806, 808 and Josephson junction 804 and second connection 820 between first and second qubit loops 806, 808 and Josephson junction 804. From the perspective of the Josephson junction, a two wing qubit will behave in the same manner as an RF SQUID flux qubit, such as those in FIGS. 1A and 1B. At zero applied flux, the magnitude of current flowing in each wing will be half of what flows through the Josephson junction. The persistent current flowing through the junction is split when flowing into the parallel wings, such that the total persistent current through the junction is the combination of the persistent current flowing in each wing. The total effective body inductance will be equal to the parallel combination of the inductances of the two wings. In the implementation of FIG. 8, the rotational direction of current flow will be opposite between the two wings. In the example implementation of FIG. 8, the Josephson junction is a compound Josephson junction. In other implementations it may be a compound-compound Josephson junction, which refers to a compound Josephson junction where at least one junction is also a compound Josephson junction.

Independent control of each wing of qubit 802 may be provided by a flux bias source, such as flux bias lines that externally apply bias current to the qubit loops. First qubit loop 806 may be in communication with a first flux bias line 810, and second qubit loop 808 may be in communication with a second flux bias line 812. First flux bias line 810 may receive signals independently from second flux bias line 812, allowing for independent control of each qubit loop. As discussed above, first qubit loop 806 and second qubit loop 808 may partially overlap along a shared portion 814. The two wings 806, 808 of qubit 802 allow two different current paths, one with the current flowing through the Josephson junction and into the wings, which responds to the difference in flux bias between the wings, and the second with the current flowing only around the outer loop formed by the two wings, which responds to the sum of flux in the wings.

Figure 9A:
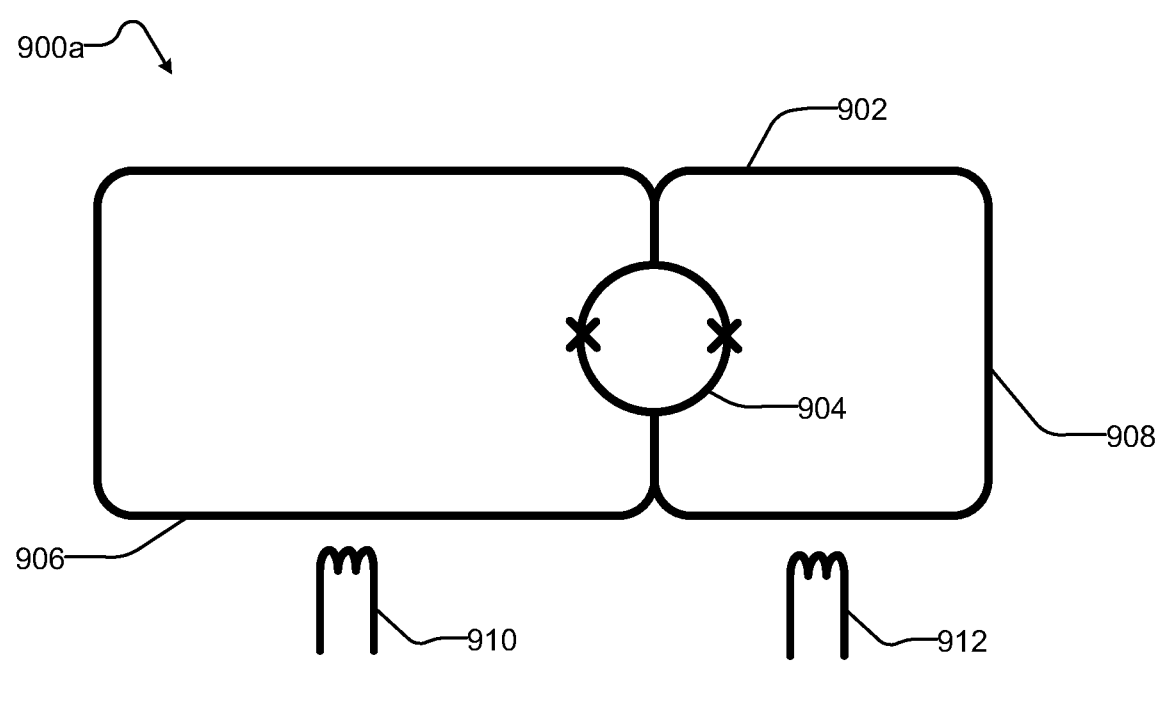
FIG. 9A is a schematic diagram of an example qubit having two asymmetric loops.
Figure 9B:
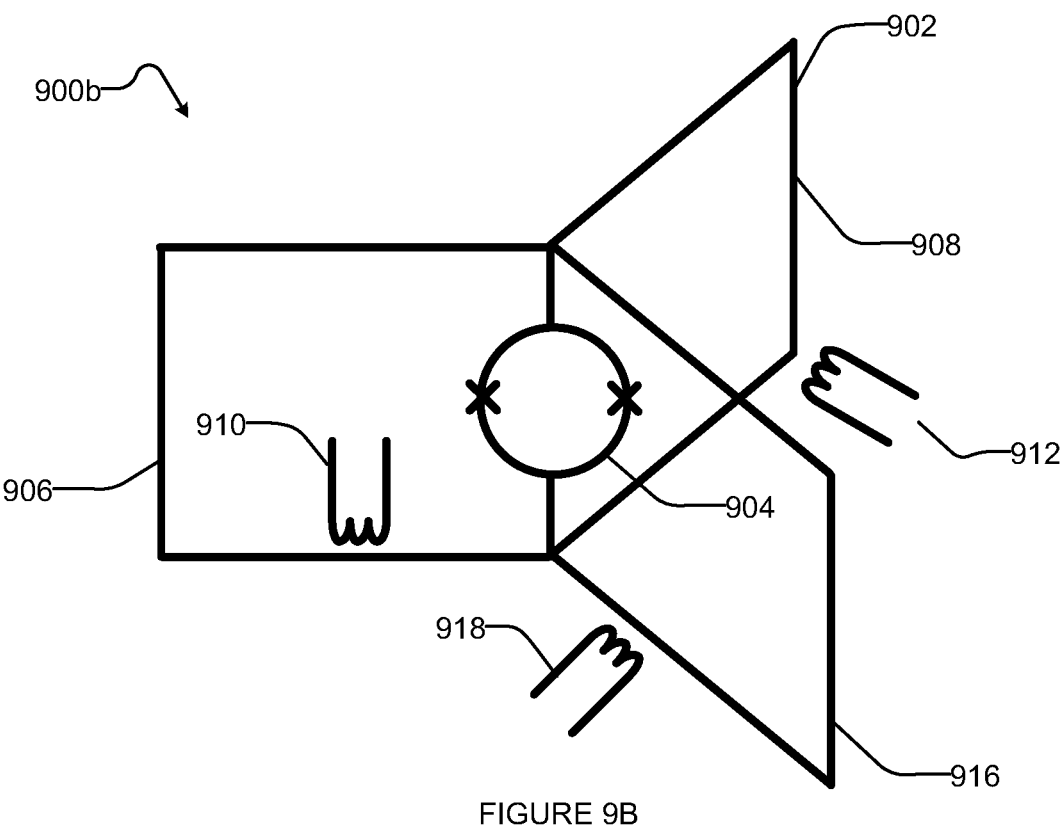
FIG. 9B is a schematic diagram of an example qubit having three loops.

In the example implementation of FIG. 9A, analog computing system 900*a* has a qubit 902 with a Josephson junction 904. In contrast with FIG. 8, where first qubit loop 806 and second qubit loop 808 are symmetric, in FIG. 9A, first qubit loop 906 and second qubit loop 908 are asymmetric. First and second flux bias lines 910 and 912 are in communication with first and second qubit loops 906 and 908. In the example implementation of FIG. 9B, analog computing system 900*b* has a qubit 902 with a Josephson junction 904, first and second qubit loops 906 and 908, and first and second flux bias lines 910 and 912. In FIG. 9B, an additional qubit loop 916 is electrically connected in parallel across Josephson junction 904 and has independent flux bias line 918. In other implementations, qubits may be designed with one or more additional qubit loops, and additional wings may be added in parallel. Increasing the number of wings may result in scaling of the potential energy of the entire qubit by a factor proportional to the number of wings.

Figure 10:
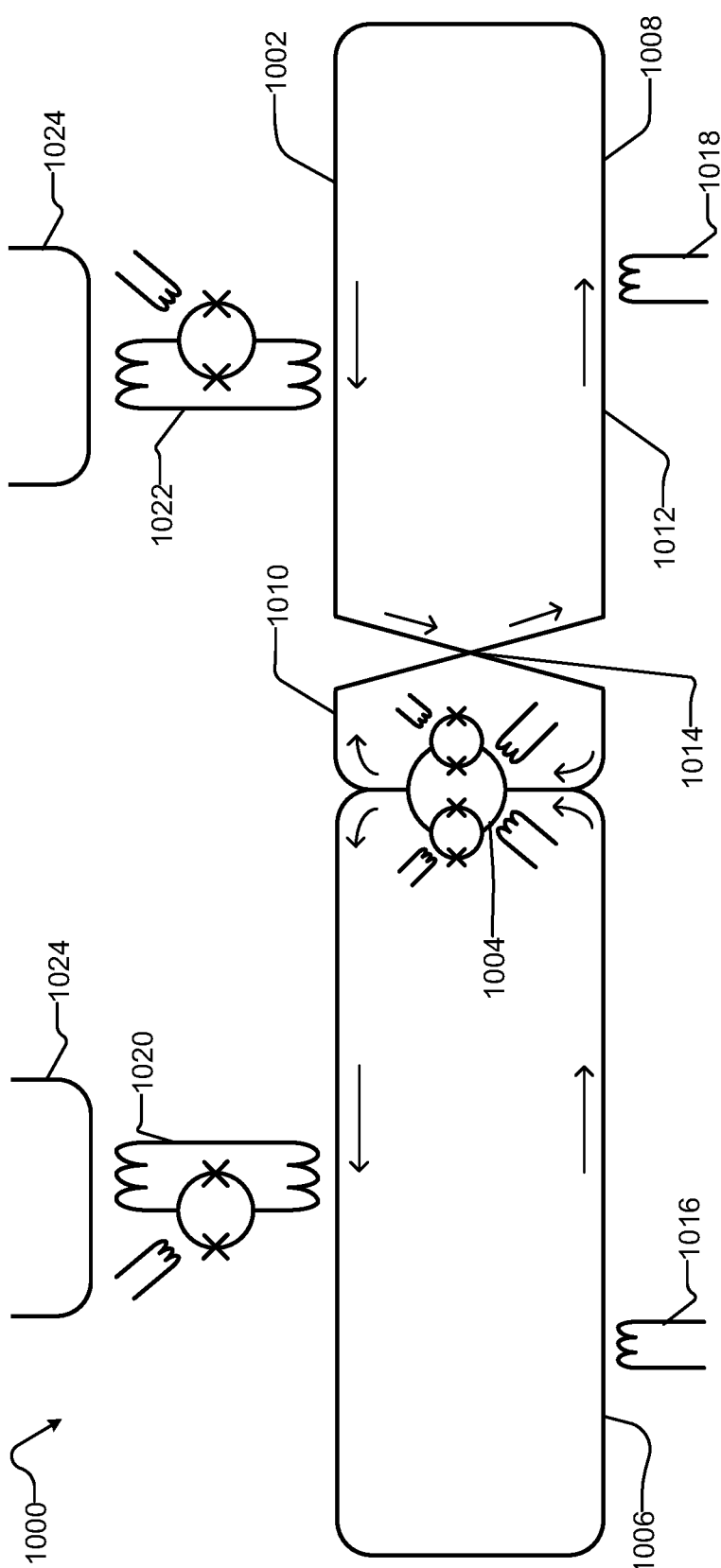
FIG. 10 is a schematic diagram of an example qubit having two loops and a twist.

In the example implementation of FIG. 10, an analog computing system 1000 has a qubit 1002 with a compound-compound Josephson junction (CCJJ) 1004, a first qubit loop 1006 formed by a first superconducting current path, and a second qubit loop 1008 formed by a second superconducting current path. First qubit loop 1006 and second qubit loop 1008 are electrically connected in parallel across Josephson junction 1004. Second qubit loop 1002 has a first portion 1010 in communication with Josephson junction 1004, a second portion 1012 spaced from Josephson junction 1004, and a crossing 1014 separating first portion 1010 and second portion 1012. Current in first portion 1010 travels in a first rotational direction (e.g., illustrated as clockwise), and current in second portion 1012 travels in a second rotational direction (e.g., illustrated as counterclockwise) that is opposite to the first rotational direction. It will be understood that the orientation shown in the example implementation of FIG. 10 may be reversed, such that the first rotational direction is counterclockwise and the second rotational direction is clockwise. It will be understood that the crossing acts as a "twist" in the second qubit loop and may be formed by the superconducting material crossing in layers that are spaced orthogonally (e.g., vertically) apart in a multi-layer circuit. Providing a twist in one wing of the qubit may allow the entire qubit to act like a longer single loop qubit without a twist. The twist in one wing may homogenize the sense of persistent current within the circuit. As shown in FIG. 10, while the current directions are reversed near the CCJJ, the current travelling through the outer portions of the qubit is generally counterclockwise.

Analog computing system 1000 further has first flux bias line 1016 and second flux bias line 1018, as well as first coupler 1020 and second coupler 1022 tunably coupled to first qubit loop 1006 and second qubit loop 1008 respectively. In other implementations an analog computing system may have one or more than two couplers tunably coupled to one of a first qubit loop and a second qubit loop. First coupler 1020 and second coupler 1022 may couple qubit 1002 to another qubit 1024, or to multiple other qubits or other devices. Couplings may be made to neighboring qubits along the length of the wings. By decreasing the wing length as additional wings are added, connectivity may be increased for the same energy scale. Conversely, for a fixed connectivity, the energy scale may be increased by decreasing the wing length and increasing the number of wings.

Figure 11:
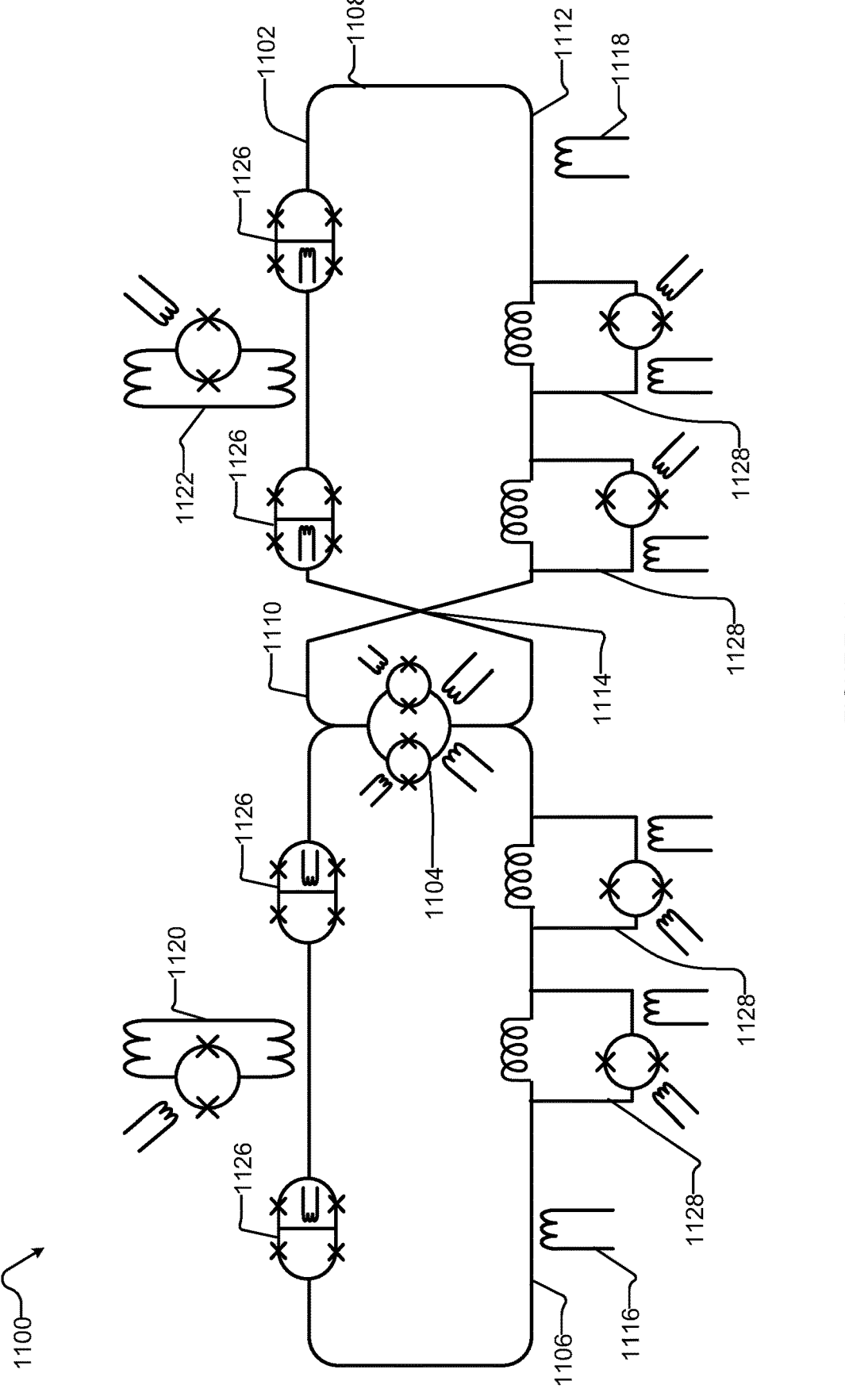
FIG. 11 is a schematic diagram of an example qubit having two loops, a twist, and further devices.

In the example implementation of FIG. 11, an analog computing system 1100 has qubit 1102, CCJJ 1104, first qubit loop 1106, and second qubit loop 1108. Second qubit loop 1108 has a first portion 1110, a second portion 1112, and a crossing 1114. Qubit 1102 is similar to qubit 1002, with additional devices in communication with qubit loops 1106 and 1108 beyond flux bias lines 1116 and 1118 and couplers 1120 and 1122. This includes a plurality of inductors 1126 disposed along each of first qubit loop 1106 and second qubit loop 1108, each of the plurality of inductors 1126 being tunable to provide a corresponding tunable inductance, as discussed in detail above. Also shown are persistent current compensators 1128, which may be coupled to a signal line and provide a variety of waveforms as discussed in U.S. Pat. No. 9,015,215 (compensators referred to therein as multipliers). The qubits described herein may include other devices such as programming, readout, and calibration devices, and may also include other quantities of the devices shown.

It will be understood that the structures shown in FIGS. 10 and 11 are example implementations of butterfly qubits. For example, Josephson junction 1004 is shown as a compound-compound Josephson junction, but may also be a compound Josephson junction with one junction on each side of the loop or may have other numbers of junctions. The bias lines shown may provide independent biases, or they may be connected in series and driven by a single source. The biases provided to either side of the loop may be the same, or different biases may be provided. Each bias shown, including biases 1016 and 1018, as well as bias lines connected to the Josephson junctions and couplers, may be provided by more than one bias. For example, in some implementations, each bias line shown may be provided by two independent lines, with one line being driven by an external room-temperature source, and one being driven by an on-chip Digital-to-Analog Converter (DAC). As discussed above, these are example implementations, and the circuit may not include all of the devices shown, may include other devices such as programming, readout, and calibration devices, and may include other quantities of the devices shown.

The methods (500, 600) described above may be used with the qubits (802, 902, 1002, and 1102) described above.

Throughout this specification, the terms "problem Hamiltonian" and "final Hamiltonian" are used interchangeably unless the context dictates otherwise. Certain states of the quantum processor are, energetically preferred, or simply preferred by the problem Hamiltonian. These include the ground states but may include excited states.

Hamiltonians such as $H_D$ and $H_P$ in the above two equations, respectively, may be physically realized in a variety of different ways. A particular example is realized by an implementation of superconducting qubits.

Examples of superconducting qubits include superconducting flux qubits, superconducting charge qubits, and the like. In a superconducting flux qubit, the Josephson energy dominates or is equal to the charging energy. In a charge qubit it is the reverse. Examples of flux qubits that may be used include RF-SQUIDs, which include a superconducting loop interrupted by one Josephson junction, persistent current qubits, which include a superconducting loop interrupted by three Josephson junctions, and the like. See, examples of RF-SQUID qubits in Bocko, et al., 1997, IEEE Trans. on Appl. Supercond. 7, 3638; Friedman, et al., 2000, Nature 406, 43; and Harris, et al., 2010, Phys. Rev. B 81, 134510; or persistent current qubits, Mooij et al., 1999, Science 285, 1036; and Orlando et al., 1999, Phys. Rev. B 60, 15398. In addition, hybrid charge-phase qubits, where the energies are equal, may also be used. Further details of superconducting qubits may be found in Makhlin, et al., 2001, Rev. Mod. Phys. 73, 357; Devoret et al., 2004, arXiv:cond-mat/0411174; Zagoskin and Blais, 2007, Physics in Canada 63, 215; Clarke and Wilhelm, 2008, Nature 453, 1031; Martinis, 2009, Quantum Inf. Process. 8, 81; and Devoret and Schoelkopf, 2013, Science 339, 1169. In some embodiments, the qubits and couplers are controlled by on chip circuitry. Examples of on-chip control circuitry can be found in U.S. Pat. Nos. 7,876,248; 7,843,209; 8,018,244; 8,098,179; 8,169,231; and 8,786,476. Further details and implementations of exemplary quantum processors that may be used in conjunction with the present systems and devices are described in, for example, U.S. Pat. Nos. 7,533,068; 8,008,942; 8,195,596; 8,190,548; and 8,421,053.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Pat. Nos. 7,135,701; 7,418,283; 8,536,566; 9,015,215; 9,152,923; PCT Application No. US2018/066613; and U.S. Patent Application No. 62/951,738.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. An analog computing system comprising a qubit, the qubit comprising:
    a Josephson junction;
    a first qubit loop formed by a first superconducting current path; and
    a second qubit loop formed by a second superconducting current path;
    wherein the first qubit loop and the second qubit loop are electrically connected in parallel across the Josephson junction, and a position of the Josephson junction along the first qubit loop defines a critical distance dividing the first qubit loop into a near inductor regime and a far inductor regime where adding a lumped inductance in the near inductor regime decreases a qubit capacitance at the Josephson junction and where adding the lumped inductance in the far inductor regime increases the qubit capacitance at the Josephson junction, the analog computing system further comprising:
    a plurality of inductors disposed along the first qubit loop, each of the plurality of inductors tunable to provide a tunable inductance, the plurality of inductors comprising:
    one or more near inductors, each near inductor disposed in the near inductor regime; and
    one or more far inductors, each far inductor disposed in the far inductor regime.

2. The analog computing system according to claim 1 further comprising one or more couplers tunably coupleable to the first qubit loop, each of the one or more couplers tunable to provide a respective coupling strength with the qubit.

3. The analog computing system according to claim 2 wherein the tunable inductance for each of the plurality of inductors is tunable within a corresponding inductance range and each of the one or more couplers has a corresponding coupler-induced inductance range, each coupler-induced inductance range comprising a difference in a qubit inductance at the Josephson junction between states of the corresponding one of the one or more couplers, and a sum of the tunable inductance ranges of the plurality of inductors is greater than each of the corresponding coupler-induced inductance ranges.

4. The analog computing system according to claim 3 wherein the sum of the tunable inductance ranges of the plurality of inductors is greater than a total coupler-induced inductance range, the total coupler-induced inductance range comprising a difference between a first coupler-induced inductance and a second coupler-induced inductance, the first coupler-induced inductance comprising the qubit inductance in a first state where each of the one or more couplers is ferromagnetically coupled to the qubit and the second coupler-induced inductance comprising the qubit inductance in a second state where each of the one or more couplers is anti-ferromagnetically coupled to the qubit.

5. The analog computing system according to claim 4 wherein:

the one or more near inductors collectively are tunable to reduce the qubit capacitance from a first coupler-induced capacitance to within a first threshold of a target capacitance;

the one or more far inductors collectively are tunable to increase the qubit capacitance from a second coupler-induced capacitance to within a second threshold of the target capacitance;

the first coupler-induced capacitance comprises the qubit capacitance in a third state where each of the one or more couplers that is in the near inductor regime is anti-ferromagnetically coupled to the first qubit loop and each of the one or more couplers that is in the far inductor regime is ferromagnetically coupled to the first qubit loop; and the second coupler-induced capacitance comprises the qubit capacitance in a fourth state where each of the one or more couplers that is in the near inductor regime is ferromagnetically coupled to the first qubit loop and each of the one or more couplers that is in the far inductor regime is anti-ferromagnetically coupled to the first qubit loop.

6. The analog computing system according to claim 5 wherein, for a predetermined target qubit inductance and a predetermined set of coupling strengths for the one or more couplers, the plurality of inductors are tunable to provide a total tunable inductance for each of the first, second, third, and fourth states which increases the qubit inductance to within a third threshold of the predetermined target qubit inductance and at least one of: increases and reduces the qubit capacitance to within a fourth threshold of the target capacitance.

7. The analog computing system according to claim 2 wherein one inductor of the plurality of inductors comprises one or more inductor Josephson junctions interrupting the first qubit loop and tunable to provide a respective tunable inductance range of the one inductor of the plurality of inductors.

8. The analog computing system according to claim 7 wherein the one of the plurality of inductors comprises one or more DC-SQUIDs, the one or more DC-SQUIDs comprising the one or more inductor Josephson junctions.

9. The analog computing system according to claim 8 wherein the one of the plurality of inductors comprises a plurality of DC-SQUIDs connected in series along the first qubit loop.

10. The analog computing system according to claim 1 wherein the qubit comprises at least one secondary inductor disposed along the second qubit loop.

11. The analog computing system according to claim 10 wherein the first qubit loop and the second qubit loop partially overlap along a shared portion and a shared inductor of the plurality of inductors is disposed along the shared portion.

12. The analog computing system according to claim 11 wherein the shared inductor comprises one of the one or more near inductors.

13. The analog computing system according to claim 10 wherein the at least one secondary inductor comprises:

one or more secondary near inductors, each secondary near inductor disposed along the second qubit loop less than a second critical distance from the Josephson junction; and one or more secondary far inductors, each secondary far inductor disposed along the second qubit loop more than the second critical distance from the Josephson junction.

14. The analog computing system according to claim 13 wherein the plurality of inductors and the at least one secondary inductor collectively provide a collective tunable inductance range of at least twice a total coupler-induced inductance range.

15. The analog computing system of claim 1, further comprising a first flux bias line in communication with the first qubit loop and a second flux bias line in communication with the second qubit loop, the first flux bias line receiving signals independently from the second flux bias line.

16. The analog computing system of claim 1, wherein the second qubit loop comprises a first portion in communication with the Josephson junction and a second portion spaced from the Josephson junction, the first portion and the second portion being separated by a crossing, wherein a current in the second qubit loop travels in a first rotational direction in the first portion and a second rotational direction that is opposite to the first rotational direction in the second portion.

17. The analog computing system of claim 1, wherein the Josephson junction comprises one of a compound Josephson junction or a compound-compound Josephson junction.

18. The analog computing system of claim 1, wherein the first qubit loop and the second qubit loop partially overlap along a shared portion.

19. The analog computing system of claim 1, further comprising a coupler tunably coupled to one of the first qubit loop and the second qubit loop.

20. The analog computing system of claim 19, further comprising a second qubit coupled to the coupler.

21. The analog computing system of claim 1, wherein the first qubit loop and the second qubit loop are symmetric about an axis of the Josephson junction, the axis of the Josephson junction intersecting a first connection between the first qubit loop and the second qubit loop and the Josephson junction and a second connection between the first qubit loop and the second qubit loop and the Josephson junction.

22. The analog computing system of claim 1, further comprising one or more additional qubit loops electrically connected in parallel across the Josephson junction.

* * * * *